(12) United States Patent
Kawakami et al.

(10) Patent No.: US 11,711,198 B2
(45) Date of Patent: Jul. 25, 2023

(54) SYNCHRONOUS DETECTION APPARATUS, SYNCHRONOUS DETECTION METHOD, AND PROGRAM

(71) Applicant: NIPPON TELEGRAPH AND TELEPHONE CORPORATION, Tokyo (JP)

(72) Inventors: Hiroto Kawakami, Musashino (JP); Shoichiro Kuwahara, Musashino (JP); Yoshiaki Kisaka, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/628,041

(22) PCT Filed: Jul. 25, 2019

(86) PCT No.: PCT/JP2019/029147
§ 371 (c)(1),
(2) Date: Jan. 18, 2022

(87) PCT Pub. No.: WO2021/014629
PCT Pub. Date: Jan. 28, 2021

(65) Prior Publication Data
US 2022/0263645 A1    Aug. 18, 2022

(51) Int. Cl.
*H04L 7/02*    (2006.01)
(52) U.S. Cl.
CPC ..................... *H04L 7/02* (2013.01)

(58) Field of Classification Search
CPC ... H04L 1/24; H04L 1/241–244; H04L 1/248; H04L 7/02; H04L 7/027; H04L 7/0272–0278
USPC ......................................... 375/221, 224–228
See application file for complete search history.

(56) References Cited

U.S. PATENT DOCUMENTS

| | | | | |
|---|---|---|---|---|
| 5,134,399 A | * | 7/1992 | Hiller | H03M 1/201 341/131 |
| 5,170,401 A | * | 12/1992 | Mohr | H04L 1/242 714/821 |
| 5,187,481 A | * | 2/1993 | Hiller | H03H 21/0012 341/131 |
| 5,189,418 A | * | 2/1993 | Bartz | H03M 1/0641 341/131 |
| 5,451,947 A | * | 9/1995 | Morrison | G01R 21/133 341/131 |

(Continued)

FOREIGN PATENT DOCUMENTS

JP    200022258 A    1/2000

*Primary Examiner* — James M Perez
(74) *Attorney, Agent, or Firm* — Harness, Dickey & Pierce, P.L.C.

(57) ABSTRACT

A synchronization detection device includes: a correction unit configured to correct sampled data of a waveform on which a dither signal is superimposed, for each period of a reference signal in accordance with a period of the dither signal; a multiplication unit configured to multiply the corrected sampled data by a weight coefficient that is different for each level of the reference signal and associated with a timing of the reference signal; and an averaging unit configured to derive, as a detection result, an average of a result of the multiplication of the corrected sampled data by the weight coefficient.

9 Claims, 15 Drawing Sheets

(56) References Cited

U.S. PATENT DOCUMENTS

| | | | | |
|---|---|---|---|---|
| 5,493,298 | A * | 2/1996 | Bartz | H03M 1/201 341/131 |
| 5,510,790 | A * | 4/1996 | Borgen | H03M 1/0641 341/131 |
| 5,530,443 | A * | 6/1996 | Borgen | H03M 1/0641 341/131 |
| 5,629,703 | A * | 5/1997 | Lewallen | H03M 1/0614 341/155 |
| 5,646,569 | A * | 7/1997 | Bruhns | G01R 19/0015 327/307 |
| 5,745,061 | A * | 4/1998 | Norsworthy | H03M 3/3287 341/131 |
| 5,786,951 | A * | 7/1998 | Welland | G11B 20/10009 |
| 5,793,318 | A * | 8/1998 | Jewett | H03M 1/0641 341/89 |
| 6,008,703 | A * | 12/1999 | Perrott | H03C 3/0925 331/23 |
| 6,016,113 | A * | 1/2000 | Binder | H03M 1/207 341/131 |
| 6,028,543 | A * | 2/2000 | Gedcke | H03M 1/0604 341/131 |
| 6,515,603 | B1 * | 2/2003 | McGrath | H03M 7/3015 341/172 |
| 6,611,221 | B1 * | 8/2003 | Soundarapandian | H03M 1/0665 375/252 |
| 6,917,318 | B2 * | 7/2005 | Lambert | H04W 88/06 341/110 |
| 6,950,048 | B1 * | 9/2005 | Slavin | H03M 1/0639 341/131 |
| 6,965,224 | B1 * | 11/2005 | Hey | H04J 3/14 327/156 |
| 7,015,733 | B2 * | 3/2006 | Giuroiu | H03L 7/1976 327/159 |
| 7,015,851 | B1 * | 3/2006 | Bruhns | H03M 1/0641 341/131 |
| 7,075,466 | B1 * | 7/2006 | Woodall | H03M 1/201 341/131 |
| 7,098,824 | B2 * | 8/2006 | Yang | H03M 1/0641 341/131 |
| 7,129,879 | B1 * | 10/2006 | Glibbery | H03M 1/1095 708/274 |
| 7,181,180 | B1 * | 2/2007 | Teo | H03L 7/1976 375/376 |
| 7,221,704 | B2 * | 5/2007 | Greenberg | H03K 7/06 375/228 |
| 7,230,981 | B2 * | 6/2007 | Hill | G01R 31/31709 332/124 |
| 7,277,033 | B1 * | 10/2007 | Kriz | H03M 1/0641 341/131 |
| 7,346,122 | B1 * | 3/2008 | Cao | H04L 25/03343 375/296 |
| 7,457,350 | B2 * | 11/2008 | Baker | H04B 1/71637 370/347 |
| 7,782,235 | B1 * | 8/2010 | Velazquez | H03M 1/1052 455/303 |
| 8,165,255 | B2 * | 4/2012 | Sobchak | H03H 17/0685 708/319 |
| 8,174,418 | B2 * | 5/2012 | Graetz | H03B 29/00 341/131 |
| 8,471,740 | B2 * | 6/2013 | Dinc | H03M 1/0641 341/120 |
| 9,020,361 | B2 * | 4/2015 | Kawakami | H04B 10/50575 398/198 |
| 9,136,861 | B1 * | 9/2015 | Fleishman | H03M 1/201 |
| 9,900,145 | B2 * | 2/2018 | Yang | H03K 5/133 |
| 10,313,015 | B2 * | 6/2019 | Kawakami | H04B 10/50575 |
| 10,411,923 | B2 * | 9/2019 | Stojanovic | H04L 25/03343 |
| 10,659,069 | B2 * | 5/2020 | Ali | H03M 3/358 |
| 10,823,989 | B2 * | 11/2020 | Kawakami | G02F 1/01 |
| 10,911,061 | B2 * | 2/2021 | Cameron | G01C 21/188 |
| 11,159,242 | B2 * | 10/2021 | Kawakami | H04B 10/54 |
| 11,397,363 | B2 * | 7/2022 | Kawakami | H04B 10/5053 |
| 2002/0039395 | A1 * | 4/2002 | Buchwald | H04L 25/03006 375/355 |
| 2003/0039330 | A1 * | 2/2003 | Castiglione | H03L 7/0898 375/376 |
| 2004/0213338 | A1 * | 10/2004 | Strawczynski | H04B 10/077 375/224 |
| 2004/0264615 | A1 * | 12/2004 | Ho | H04L 25/03006 375/355 |
| 2005/0117680 | A1 * | 6/2005 | Raha | H03L 7/093 375/376 |
| 2005/0163232 | A1 * | 7/2005 | Norsworthy | H03M 3/392 375/247 |
| 2005/0207480 | A1 * | 9/2005 | Norsworthy | H03H 17/0628 375/372 |
| 2006/0088126 | A1 * | 4/2006 | Puma | H04L 27/12 375/302 |
| 2006/0104394 | A1 * | 5/2006 | Chan | H03J 7/00 375/344 |
| 2006/0203899 | A1 * | 9/2006 | Gee | H04L 25/0305 375/232 |
| 2006/0227912 | A1 * | 10/2006 | Leibowitz | H04L 1/244 375/350 |
| 2006/0291589 | A1 * | 12/2006 | Eliezer | H04L 27/365 375/302 |
| 2007/0019711 | A1 * | 1/2007 | Mallinson | H04B 1/707 375/130 |
| 2007/0189417 | A1 * | 8/2007 | Waheed | H03C 5/00 375/300 |
| 2007/0189431 | A1 * | 8/2007 | Waheed | H03C 3/0991 375/376 |
| 2008/0002788 | A1 * | 1/2008 | Akhtar | H03C 5/00 455/77 |
| 2011/0135218 | A1 * | 6/2011 | Moore | H04N 25/60 382/275 |
| 2011/0235694 | A1 * | 9/2011 | Stephens | G01R 31/31709 375/226 |
| 2011/0261871 | A1 * | 10/2011 | Staszewski | H03L 7/0991 375/224 |
| 2012/0039376 | A1 * | 2/2012 | Latham | H03M 3/344 375/224 |
| 2012/0155865 | A1 * | 6/2012 | Kawakami | H04B 10/50572 398/43 |
| 2013/0243056 | A1 * | 9/2013 | Chmelar | H04L 7/033 375/295 |
| 2013/0249720 | A1 * | 9/2013 | Matsuura | H03M 1/06 341/118 |
| 2013/0294490 | A1 * | 11/2013 | Chandrasekaran | H04L 7/0083 375/226 |
| 2014/0336623 | A1 * | 11/2014 | Van Rens | H04L 67/12 604/528 |
| 2016/0182075 | A1 * | 6/2016 | Devarajan | H03M 1/121 341/120 |
| 2016/0359493 | A1 * | 12/2016 | Chen | H03L 7/099 |
| 2017/0179969 | A1 * | 6/2017 | Meng | H03M 1/08 |
| 2018/0323878 | A1 * | 11/2018 | Kawakami | H04B 10/516 |
| 2020/0133035 | A1 * | 4/2020 | Kawakami | H04B 10/556 |
| 2021/0175878 | A1 * | 6/2021 | Galton | H03M 7/3026 |
| 2021/0194594 | A1 * | 6/2021 | Kawakami | H04B 10/548 |
| 2022/0043320 | A1 * | 2/2022 | Kawakami | H04B 10/07955 |
| 2022/0045686 | A1 * | 2/2022 | Kozlov | H03M 1/0641 |
| 2022/0263645 | A1 * | 8/2022 | Kawakami | H04L 7/02 |
| 2022/0271771 | A1 * | 8/2022 | Zheng | H03M 1/68 |
| 2023/0004027 | A1 * | 1/2023 | Kawakami | H04B 10/50575 |

* cited by examiner

SYNCHRONOUS DETECTION APPARATUS, SYNCHRONOUS DETECTION METHOD, AND PROGRAM

CROSS-REFERENCE TO RELATED APPLICATIONS

This application is a 371 U.S. National Phase of International Application No. PCT/JP2019/029147 filed on Jul. 25, 2019. The entire disclosure of the above application is incorporated herein by reference.

TECHNICAL FIELD

The present invention relates to a synchronization detection device, a synchronization detection method, and a program.

BACKGROUND ART

A synchronization detection circuit (for example, a lock-in amplifier) configured to detect a faint signal in noise has been widely used. For example, the synchronization detection circuit is widely used for demodulation of a radio signal. The synchronization detection circuit is also widely used for a feedback system for stabilizing output from a controlled object (device).

FIG. 13 is a diagram illustrating an exemplary direct current (DC) power source and an exemplary controlled object. The DC power source outputs control voltage to the controlled object. The controlled object generates an output (for example, heat amount or light intensity) of a predetermined positive value in accordance with the control voltage.

FIG. 14 is a diagram illustrating the relation between the control voltage and the output from the controlled object. The axis of abscissas represents the control voltage. The axis of ordinates represents the output from the controlled object. The output from the controlled object changes as illustrated with a solid line in accordance with the control voltage. In FIG. 14, an aim is to maintain the output from the controlled object at maximum. When operation of the controlled object is stable and hardly affected by change in external environment, the DC power source outputs voltage determined as a target to the controlled object. The controlled object maintains the maximum output as the DC power source continuously outputs the control voltage to the controlled object.

However, characteristics of the output from the controlled object (typically, an industrial product) often change due to environment temperature and temporal degradation. As illustrated with a dashed line in FIG. 14, the control voltage with which the maximum output can be obtained slightly changes from the target. To achieve an aim of maintaining the maximum output by the controlled object, a feedback system including a synchronization detection circuit as illustrated in FIG. 15 is widely used.

FIG. 15 is a diagram illustrating an exemplary configuration of a feedback system 300. The feedback system 300 can be implemented by using a digital circuit or an analog circuit. Hereinafter, as an example, the feedback system is implemented by using a digital circuit.

The feedback system 300 includes a calculation unit, a dither signal generator, an addition unit, a digital-analog converter (DAC), a controlled object, a tap, a monitor unit, an ADC, and a synchronization detection circuit (a multiplication unit or a low-pass filter (LPF)).

The calculation unit generates a control signal in accordance with an output from the synchronization detection circuit. The dither signal generator generates a dither signal used to execute dithering on the control signal. In the dither signal, the two values of a positive value and a negative value are switched at a particular frequency. The frequency of the dither signal is denoted as "fd". The addition unit performs addition to the control signal at the timing of the frequency "fd" of the dither signal. The addition unit executes this addition processing by numerical calculation because the control signal and the dither signal are digital data signals. The addition unit outputs a result of the addition processing to the DAC. The DAC generates control voltage in accordance with the result of the addition processing. The DAC outputs the control voltage to the controlled object. When the controlled object is, for example, a light source, the controlled object outputs light in accordance with the control voltage. The tap outputs part of the output from the controlled object to the monitor unit.

The dither signal that changes at the frequency "fd" is superimposed on the control voltage. Thus, the output from the controlled object includes minute modulation due to the dither signal that changes at the frequency "fd". Normally, the amplitude of the modulation is maintained small enough to cause no problem in practical use. Hereinafter, a frequency component of the dither signal is referred to as a "dither component".

The dither signal generator continuously generates the dither signal. Even when the dither signal is continuously generated, the dither component may be lost in the output from the controlled object in accordance with the state of the controlled object. In addition, the phase of the dither component may be inverted in accordance with the state of the controlled object.

FIG. 16 is a diagram illustrating exemplary dependency of the controlled object on the control voltage. The axis of abscissas represents the control voltage. The axis of ordinates represents the output from the controlled object. FIG. 17 is a diagram illustrating an exemplary dither signal and an exemplary output waveform of the controlled object. Ranges "A", "B", and "C" illustrated in FIG. 16 are associated with waveforms "A", "B", and "C" illustrated in FIG. 17.

In a normal feedback system, the amplitude of the dither component is small enough to cause no problem in practical use, but in FIG. 17, the amplitude of the dither component is illustrated in an exaggerated manner to facilitate understanding. Small phase delay in accordance with a response time of the controlled object may occur between the phase of the dither signal and the phase of the dither component superimposed on the output from the controlled object. The phase delay needs to be corrected when the phase delay is large, but the phase delay is ignored in the following description unless otherwise stated because correction of the phase delay is not essential.

When the control voltage is lower than the target (in the case of "A"), the dither component of the frequency "fd" occurs in the output from the controlled object. The phase of the dither component is the same as the phase of the dither signal. When the control voltage is equal to the target (in the case of "B"), no dither component occurs in the output from the controlled object, but a component (second-order harmonic) of a frequency "2fd" attributable to returning occurs in the output from the controlled object. When the control voltage is higher than the target (in the case of "C"), the dither component of the frequency "fd" occurs in the output from the controlled object. When the control voltage is higher than the target (in the case of "C"), the phase of the dither component is opposite to the phase of the dither signal.

Description of the exemplary configuration of the feedback system 300 is continued with reference to FIG. 15. The output from the controlled object is detected by the monitor unit (monitor circuit). When the output from the controlled object (heat source machine) is heat, a thermometer may be used as the monitor unit. When the output from the controlled object (such as an optical communication machine or a light source) is light, part of the output from the controlled object may be bifurcated by the tap including a light waveguide and may be input to the monitor unit. The following description will be made on a monitor system using the tap. The dither component or the second-order harmonic in the output from the controlled object is detected by the monitor unit.

The dither component or the second-order harmonic of the dither component detected by the monitor unit is transferred to an analog-digital converter (ADC), converted into digital data, and then input to the synchronization detection circuit as part of a digital controller.

The dither signal generator is also used as a generator of a reference clock (RefClk) of synchronization detection. When the phase of the dither component is delayed in accordance with the response time of the controlled object, skew processing may be executed on the reference clock. The dither signal generator outputs the reference clock to the multiplication unit of the synchronization detection circuit. In the feedback system 300, the multiplication unit multiplies an output from the ADC by the reference clock. The multiplication executes multiplication processing by numerical calculation because the output from the ADC and the reference clock are digital data.

Similarly to the dither signal illustrated in FIG. 17, the reference clock evenly varies to positive and negative values. Accordingly, a result of the multiplication processing varies to positive and negative values. However, the result of the multiplication processing not evenly varies to positive and negative values. This is because the size of the output from the ADC is non-uniform although the output from the ADC is constantly a positive value proportional to the output from the controlled object illustrated in FIG. 17. In other words, the absolute value of the result of the multiplication processing is non-uniform.

In the case of "A" illustrated in FIG. 17, the absolute value of the result of the multiplication processing is large when the result of the multiplication processing is a positive value. In the case of "B" illustrated in FIG. 17, the absolute value of the result of the multiplication processing is substantially equal. However, protrusion parts attributable to returning in the waveform of the output from the controlled object are not equal. In the case of "C" illustrated in FIG. 17, the absolute value of the result of the multiplication processing is large when the result of the multiplication processing is a negative value.

A digital low-pass filter (digital LPF) averages the result of the multiplication processing. The calculation unit (arithmetic processing circuit) acquires a synchronization detection result from the digital low-pass filter. In the case of "A" illustrated in FIG. 17, the calculation unit acquires a positive value from the digital low-pass filter. In the case of "B" illustrated in FIG. 17, the calculation unit acquires zero from the digital low-pass filter. In the case of "C" illustrated in FIG. 17, the calculation unit acquires a negative value from the digital low-pass filter.

The calculation unit maintains the output from the controlled object at a maximum value by feedback control. The calculation unit increases the value of the control signal when the synchronization detection result is a positive value. The calculation unit maintains the value of the control signal when the synchronization detection result is zero. The calculation unit decreases the value of the control signal when the synchronization detection result is negative.

In a feedback system, the phase (sign) of the synchronization detection result is more important than the magnitude of the absolute value of the synchronization detection result. For feedback gain optimization, it is desirable to obtain a synchronization detection result proportional to the amplitude of the dither component. However, in a case in which non-linearity exists between the amplitude of the dither component and the synchronization detection result, as well, overage and shortage of the control signal are accurately determined as long as the sign of the synchronization detection result is correctly obtained. As long as overage and shortage of the control signal are accurately determined, feedback control is possible even when non-linearity exists between the amplitude of the dither component and the synchronization detection result (refer to Patent Literature 1).

CITATION LIST

Patent Literature

Patent Literature 1: Japanese Patent Laid-open No. 2000-22258

SUMMARY OF THE INVENTION

Technical Problem

In an actual feedback system, noise is constantly superimposed on the output from the controlled object depending on disturbance on the controlled object and circuit noise of the monitor unit. Thus, noise is constantly superimposed on the output from the ADC as well.

FIG. 18 is a diagram illustrating an exemplary reference clock, an exemplary output from the controlled object, and an exemplary output from the ADC. The digital circuit can process change of a discrete amount but cannot process change of a continuous amount. As illustrated with filled circles in FIG. 18, the output from the ADC is sampled at a constant time interval. The digital circuit executes data processing on the sampled data.

In FIG. 18, six pieces of sampled data of the output from the ADC are acquired in a period "Td" corresponding to the reciprocal of the dithering frequency "fd". However, typically, the amplitude of the dither component is extremely small and equivalent to the amplitude of circuit noise. Thus, to accurately perform synchronization detection, it is important that the multiplication processing is performed a large number of times and smoothing is performed for a long time by the digital LPF. The digital low-pass filter smooths the result of the multiplication processing for a long time. Thus, a trade-off relation exists between improvement of the accuracy of synchronization detection and reduction of a processing time. In this manner, it is impossible to reduce the processing time required for the accuracy of synchronization detection to be at certain accuracy or higher, which has been a problem.

In view of the above-described circumstances, an object of the present invention is to provide a synchronization detection device, a synchronization detection method, and a program, which are capable of reducing a processing time required for the accuracy of synchronization detection to be at certain accuracy or higher.

Means for Solving the Problem

An aspect of the present invention is a synchronization detection device including: a correction unit configured to correct sampled data of a waveform on which a dither signal is superimposed, for each period of a reference signal in accordance with a period of the dither signal; a multiplication unit configured to multiply the corrected sampled data by a weight coefficient that is different for each level of the reference signal and associated with a timing of the reference signal; and an averaging unit configured to derive, as a detection result, an average of a result of the multiplication of the corrected sampled data by the weight coefficient.

Effects of the Invention

According to the present invention, it is possible to reduce a processing time required for the accuracy of synchronization detection to be at certain accuracy or higher.

DESCRIPTION OF EMBODIMENTS

Embodiments of the present invention will be described below in detail with reference to the accompanying drawings.

First Embodiment

Figure 1:
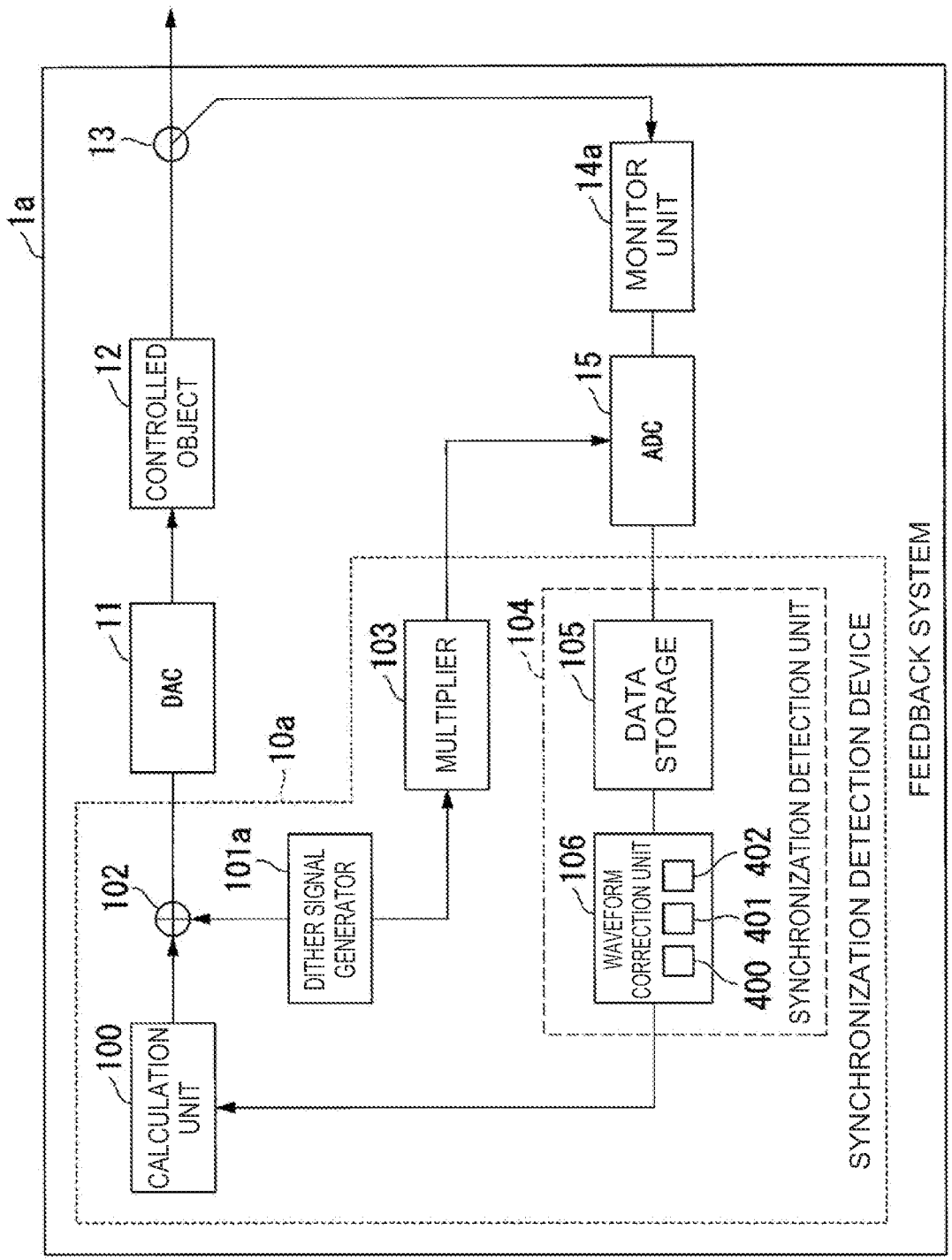
FIG. 1 is a diagram illustrating an exemplary configuration of a feedback system in a first embodiment.

FIG. 1 is a diagram illustrating an exemplary configuration of a feedback system 1a. The feedback system 1a includes a synchronization detection device 10a (synchronization detection circuit).

The synchronization detection device 10a is a device configured to detect a dither component in noise.

In a first embodiment, the synchronization detection device 10a executes waveform correction processing on an output (waveform) from a controlled object when at least one of a first condition and a second condition holds. Accordingly, the synchronization detection device 10a can increase the ratio of a dither component relative to a noise component in the output from the controlled object.

The first condition as a reference of determination whether to execute waveform correction is such a condition that intensity change uncorrelated with intensity change of a reference clock (reference signal) is detected in the output (waveform) from the controlled object. It can be determined that such intensity change is not a dither component but is noise. Thus, the synchronization detection device 10a reduces the intensity change (noise) before multiplication processing is executed.

The second condition as a reference of determination whether to execute waveform correction is such a condition that intensity change having strong correlation or inverse correlation (correlation or inverse correlation equal to or larger than a predetermined value) with the reference clock is detected in the output (waveform) from the controlled object. It can be determined that such intensity change is not noise but is a dither component. The synchronization detection device 10a enhances the intensity change (dither component) through digital processing before multiplication processing is executed. The synchronization detection device 10a can increase the dither component relative to noise. A third condition is that intensity change inconsistent with the pattern of the reference signal is detected. It can be determined that the inconsistent intensity change is not a dither component but is noise, and thus the inconsistent intensity change is reduced through digital processing before multiplication processing is performed.

The synchronization detection device 10a executes the waveform correction processing in accordance with at least one of the first to third conditions before multiplication processing is executed. Accordingly, the synchronization detection device 10a can increase the signal-to-noise ratio of synchronization detection to a certain ratio or larger in a short processing time.

The feedback system 1a includes the synchronization detection device 10a, a DAC 11, a controlled object 12, a tap 13, a monitor unit 14a, and an ADC 15. The synchronization detection device 10a includes a calculation unit 100, a dither signal generator 101a, an addition unit 102, a multiplier 103, and a synchronization detection unit 104. The synchronization detection unit 104 includes a data storage 105 and a waveform correction unit 106. The waveform correction unit 106 includes a correction unit 400, a multiplication unit 401, and an averaging unit 402.

When the level of signal delay (delay in the response time of a control system) is not negligible, the synchronization detection device 10a may include a delay circuit for skew compensation between the dither signal generator 101a and the multiplier 103.

Figure 2:
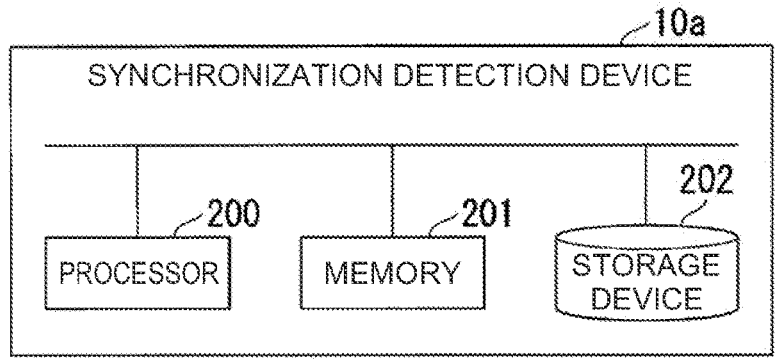
FIG. 2 is a diagram illustrating an exemplary hardware configuration of a synchronization detection device in the first embodiment.

FIG. 2 is a diagram illustrating an exemplary hardware configuration of the synchronization detection device 10a. The synchronization detection device 10a includes a processor 200, a memory 201, and a storage device 202.

Each functional component illustrated in FIG. 1 is implemented as software as the processor 200 such as a central processing unit (CPU) executes a program loaded onto the memory 201 from the storage device 202 as a non-transitory recording medium (non-temporary recording medium).

The data storage 105 illustrated in FIG. 1 is implemented by using, for example, the storage device 202. The program may be recorded in a computer-readable recording medium. The computer-readable recording medium is, for example, a portable medium such as a flexible disk, a magneto optical disc, a read only memory (ROM), or a compact disc read only memory (CD-ROM), or a non-temporary recording medium, such as the storage device 202, which is a hard disk built in a computer system. The program may be transmitted through an electric communication line.

Part or all of the synchronization detection device 10a may be implemented by using, for example, hardware including an electronic circuit (or circuitry) using a large scale integration circuit (LSI), an application specific integrated circuit (ASIC), a programmable logic device (PLD), a field programmable gate array (FPGA), or the like.

Figure 16:
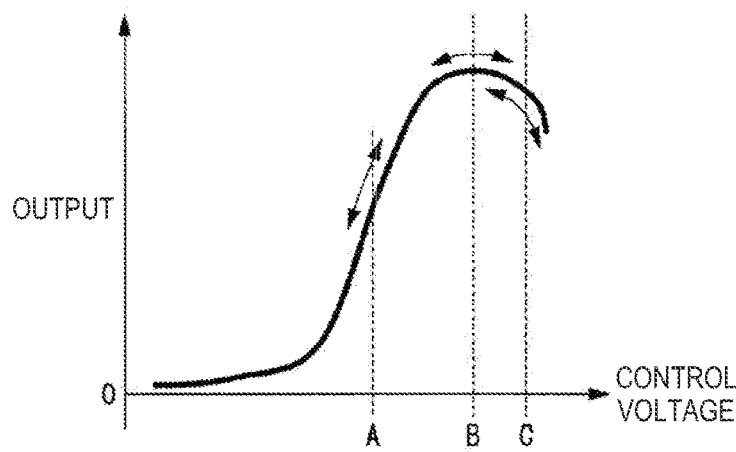
FIG. 16 is a diagram illustrating exemplary dependency of the controlled object on the control voltage.
Figure 17:
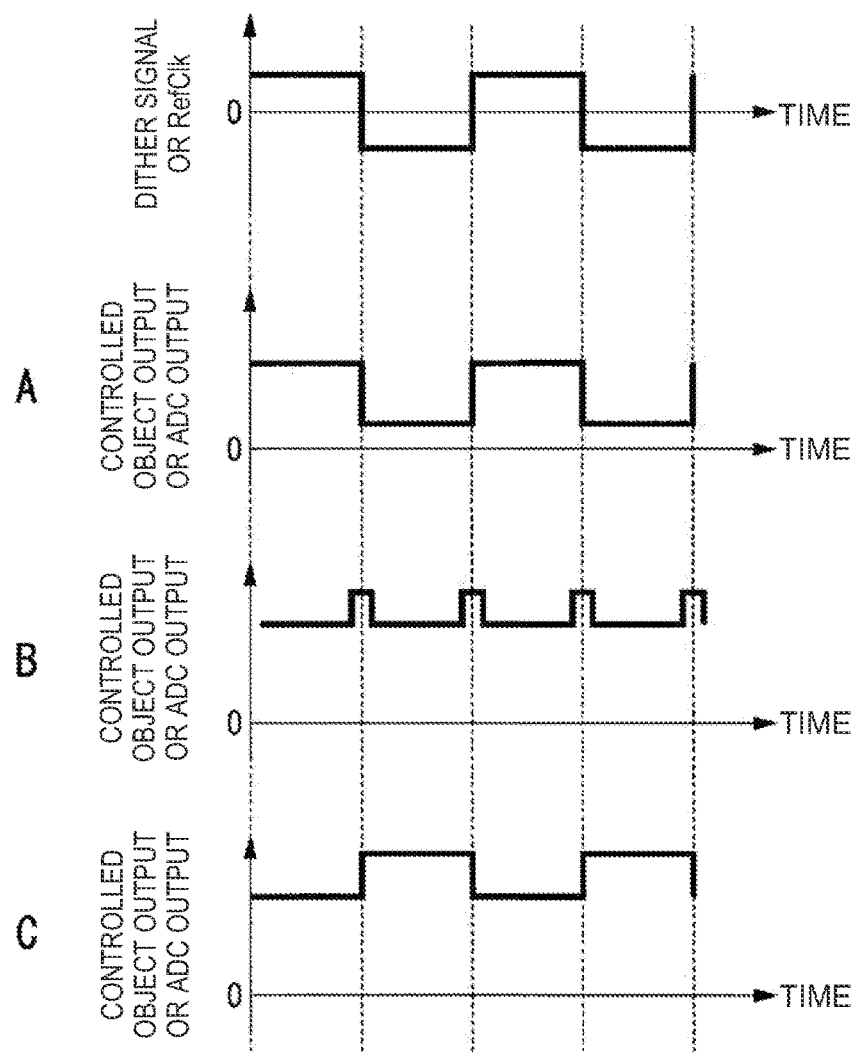
FIG. 17 is a diagram illustrating an exemplary dither signal and an exemplary output waveform of the controlled object.

The calculation unit 100 (arithmetic processing circuit) acquires a synchronization detection result from the waveform correction unit 106. In the case of "A" illustrated in FIG. 16, the calculation unit 100 acquires a positive value from the waveform correction unit 106. In the case of "B", the calculation unit 100 acquires zero from the waveform correction unit 106. In the case of "C", the calculation unit 100 acquires a negative value from the waveform correction unit 106. The calculation unit 100 generates a control signal in accordance with the synchronization detection result.

The dither signal generator 101a generates a dither signal used to execute dithering on the control signal. In the dither signal, the two values of positive and negative values are switched at a particular frequency. The frequency of the dither signal is denoted as "fd". The dither signal generator 101a generates a reference clock (RefClk) of the frequency "fd". The phase of the reference clock is synchronized with the phase of the dither signal.

The addition unit 102 acquires the dither signal from the dither signal generator 101a. The addition unit 102 adds the dither signal having the two values of positive and negative values to the control signal at the timing of the frequency "fd" generated by the dither signal generator 101a.

The DAC 11 generates control voltage in accordance with a result of this addition processing. The controlled object 12 is a predetermined device such as a heat source machine, an optical communication machine, or a light source. The controlled object 12 generates an output (for example, heat amount or light intensity) of a predetermined positive value in accordance with the control voltage. When the output from the controlled object 12 (light source) is light, part of the output from the controlled object 12 may be bifurcated by the tap 13 including a light waveguide. The tap 13 outputs part of the output from the controlled object 12 to a predetermined external device and the monitor unit 14a. The monitor unit 14a detects a dither component in the output from the controlled object 12.

The multiplier 103 acquires the reference clock of the frequency "fd" from the dither signal generator 101a. The multiplier 103 performs "n"-multiplication of the reference clock of the frequency "fd" (=1/Td) generated by the dither signal generator 101a. Hereinafter, as an example, the multiplier 103 performs "n=6" multiplication of the reference clock of the frequency "fd" generated by the dither signal generator 101a. The multiplier 103 outputs the reference clock of the multiplied frequency to the ADC 15.

The ADC 15 refers to the multiplied reference clock and samples data at the time interval of "Td/6", thereby generating sampled data (digital data). The ADC 15 outputs the sampled data to the data storage 105.

The data storage 105 stores the sampled data. When "6×p" pieces of sampled data as sampled data corresponding to "p" periods of the reference clock are stored in the data storage 105, the data storage 105 outputs the sampled data corresponding to the "p" periods to the waveform correction unit 106. The value "p" is a natural number.

The data storage 105 deletes, in the data storage 105, the sampled data corresponding to the "p" periods and output to the waveform correction unit 106. In the next "p" periods, the data storage 105 stores "6×p" pieces of sampled data corresponding to the "p" periods. The data storage 105 repeats the operation in this manner.

The correction unit 400 of the waveform correction unit 106 corrects the waveform of the output (dither component or second-order harmonic) from the ADC 15. The multiplication unit 401 of the waveform correction unit 106 executes multiplication processing by numerical calculation on the dither component or second-order harmonic having the corrected waveform. The waveform correction unit 106 executes averaging processing such as low-pass filter processing on a result of the multiplication processing.

In the following description, the value of sampled data "d" output to the waveform correction unit 106 is written as "dK_L" by using an additional character "K" and an additional character "L". Hereinafter, the value of the additional character "K" is, for example, one to "p". In the first embodiment, the value of the additional character "L" is, for example, one to six.

The value of the additional character "K" is increased by one in the period of the reference clock. Thus, the additional character "K" is an identifier of the period of the reference clock. The value of the additional character "L" is increased by one at each sampling execution. Thus, the additional character "L" is an identifier of sampled data. The value of the additional character "L" is reset to one when the value of the additional character "K" is increased by one (when one period of the reference clock has elapsed).

The sampling by the ADC 15 is synchronized with the reference clock. Thus, the waveform correction unit 106 can identify whether each piece of sampled data "dK_1" to "dK_6" is sampled data acquired in a duration in which the reference clock is a positive value or sampled data acquired in a duration in which the reference clock is a negative value.

In the first embodiment, sampled data having the additional character "L" of 1 to 3 is sampled data acquired in a duration in which the reference clock is a positive value. Sampled data having the additional character "L" of 4 to 6 is sampled data acquired in a duration in which the reference clock is a negative value.

Figure 3:
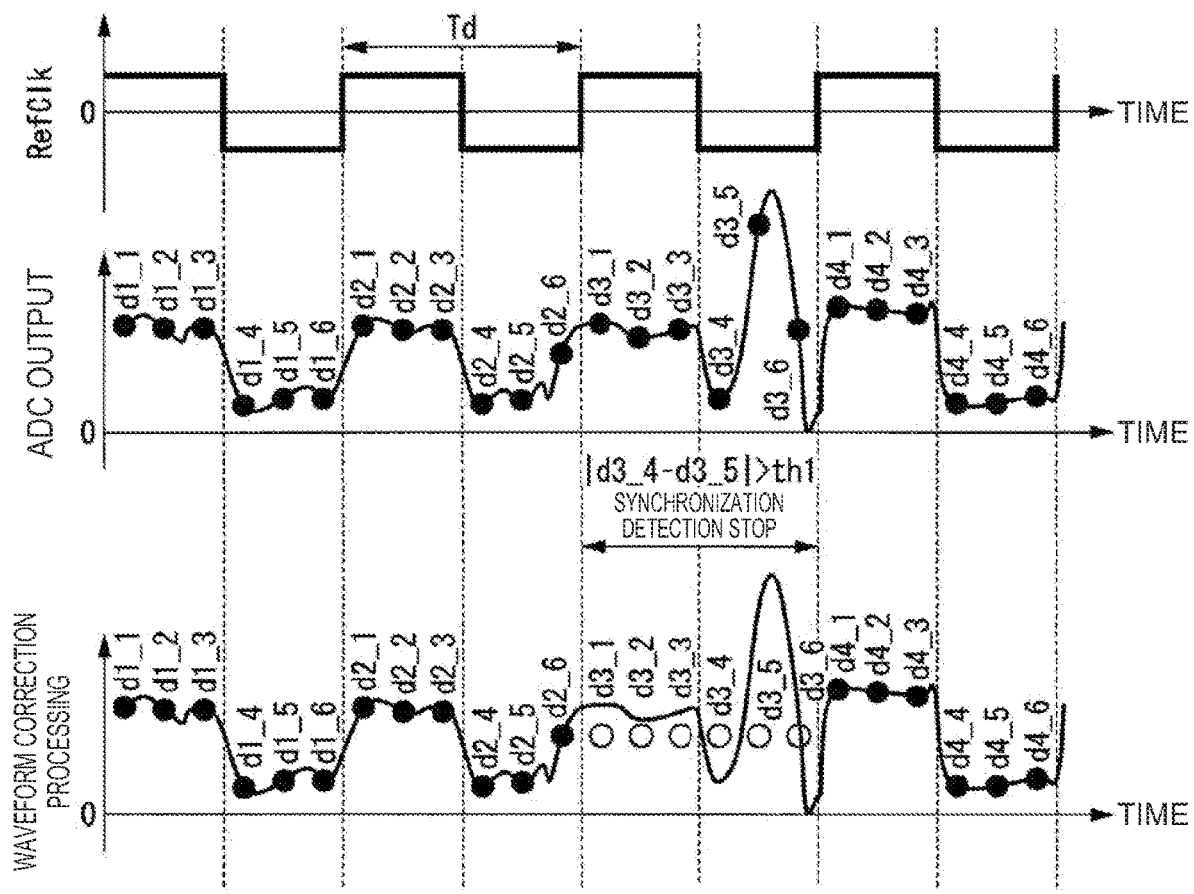
FIG. 3 is a diagram illustrating a first example of waveform correction in the first embodiment.

FIG. 3 is a diagram illustrating first example of waveform correction in the first embodiment. FIG. 3 illustrates the reference clock (RefClk), the output from the ADC, and the waveform correction processing. In FIG. 3, similarly to the case of "A" illustrated in FIG. 18, the phase of the reference clock and the phase of the output from the ADC 15 are substantially in phase, but in FIG. 3, the phase relation is uncertain due to uncertainty attributable to random noise.

The waveform correction unit 106 executes calculation (averaging processing) expressed in Expression (1) after the waveform correction processing.

$$\Sigma\{(dK\_1+dK\_2+dK\_3-dK\_4-dK\_5-dK\_6)\times W\}/(6\times p) \quad (1)$$

In the expression, Σ represents a sum over "K=1" to "K=p". The magnitude of the natural number "p" is set in accordance with the magnitude of noise in the output from the ADC 15. When the noise is at a certain level or higher, the natural number "p" is set to a predetermined large value. The initial value of the coefficient "W" is one. The waveform correction unit 106 may change the coefficient "W" when at least one of the first condition and the second condition is satisfied.

Before executing the calculation expressed in Expression (1), the waveform correction unit 106 changes the coefficient "W" for each additional character "K" through a procedure below. Alternatively, before executing the calculation expressed in Expression (1), the waveform correction unit 106 may change the value of sampled data "dK_L" through waveform correction processing below.

In FIG. 3, sampled data "d3_5" and "d3_6" output from the ADC 15 is significantly large attributable to change in external environment or circuit noise. The phase of intensity change of sampled data "d3_5" and "d3_6" is different from the phase of intensity change of the reference clock. Accordingly, the first condition is satisfied, and the waveform correction unit 106 determines that intensity change of sampled data "d3_5" and "d3_6" is noise.

Specifically, this determination is performed through a procedure below, and action is taken. Before executing the calculation expressed in Expression (1), the waveform correction unit 106 derives sampled data "dK_L−dK_(L+1)" adjacent to each other in the time of sampling by the ADC 15 while changing the additional character "K" and the additional character "L". In the example illustrated in FIG. 3, the value of "dK_L−dK_(L+1)" is mostly small when the additional character "K" is equal to or smaller than two.

For the additional character "L=3", the absolute value of "dK_3−dK_4" is relatively large. However, it is known that the magnitude of the reference clock is switched in sampled data in the range of the additional character "L=3" to "L=4". Thus, the waveform correction unit 106 recognizes, as normal variation, switching of the magnitude of sampled data in the range of the additional character "L=3" to "L=4".

The timing of sampled data of the additional characters "K=3" and "L=4" is not a moment at which the magnitude of the reference clock switches. However, in FIG. 3, the absolute value of a sampled data difference expressed as "d3_4−d3_5" is large. When the absolute value of the sampled data difference "d3_4−d3_5" exceeds a predetermined threshold value "th1", the first condition is satisfied, and thus it is determined that noise has occurred.

When it is determined that noise has occurred in a duration corresponding to the additional character "K=3", the waveform correction unit 106 executes no synchronization detection processing on sampled data acquired in the duration corresponding to the additional character "K=3".

For example, the waveform correction unit 106 sets the value of the coefficient "W" in Expression (1) to be zero only for a case of the additional character "K=3", thereby executing no synchronization detection processing on sampled data acquired in the duration of the reference clock with the additional character "K=3".

Alternatively, the waveform correction unit 106 may discard sampled data "d3_1" to d3_6" and update all pieces of sampled data "d3_1" to "d3_6" to the same value. For sampled data illustrated with hollow circles at a lower part of FIG. 3, the numerator of Expression (1) is zero for the additional character "K=3". Thus, sampled data "d3_1" to "d3_6" in a duration illustrated with hollow circles does not contribute to the synchronization detection processing.

In this manner, the waveform correction unit 106 substitutes a predetermined integer "k" into the additional character "K" of sampled data "dK_L" and detects variation (intensity change) in "n×m" pieces of continuous sampled data "dk_1" to "dk_(n×m)". The waveform correction unit 106 activates a first flag (first determination flag of the first condition) when sampled data acquired in a duration in which an output from a reference signal generator is at a high level has variation exceeding the first threshold value "th1". The waveform correction unit 106 activates a second flag (second determination flag of the first condition) when sampled data acquired in a duration in which the output from the reference signal generator is at a low level has variation exceeding the first threshold value "th1". When the first flag or the second flag is activated, the waveform correction unit 106 determines that all "n×m" pieces of sampled data "dK_L" are noise. Sampled data "dK_L" determined as noise is not used for synchronization detection. The waveform correction unit 106 may change all pieces of sampled data "dK_L" determined as noise to the same value, thereby setting zero to the synchronization detection result in the corresponding duration.

Figure 4:
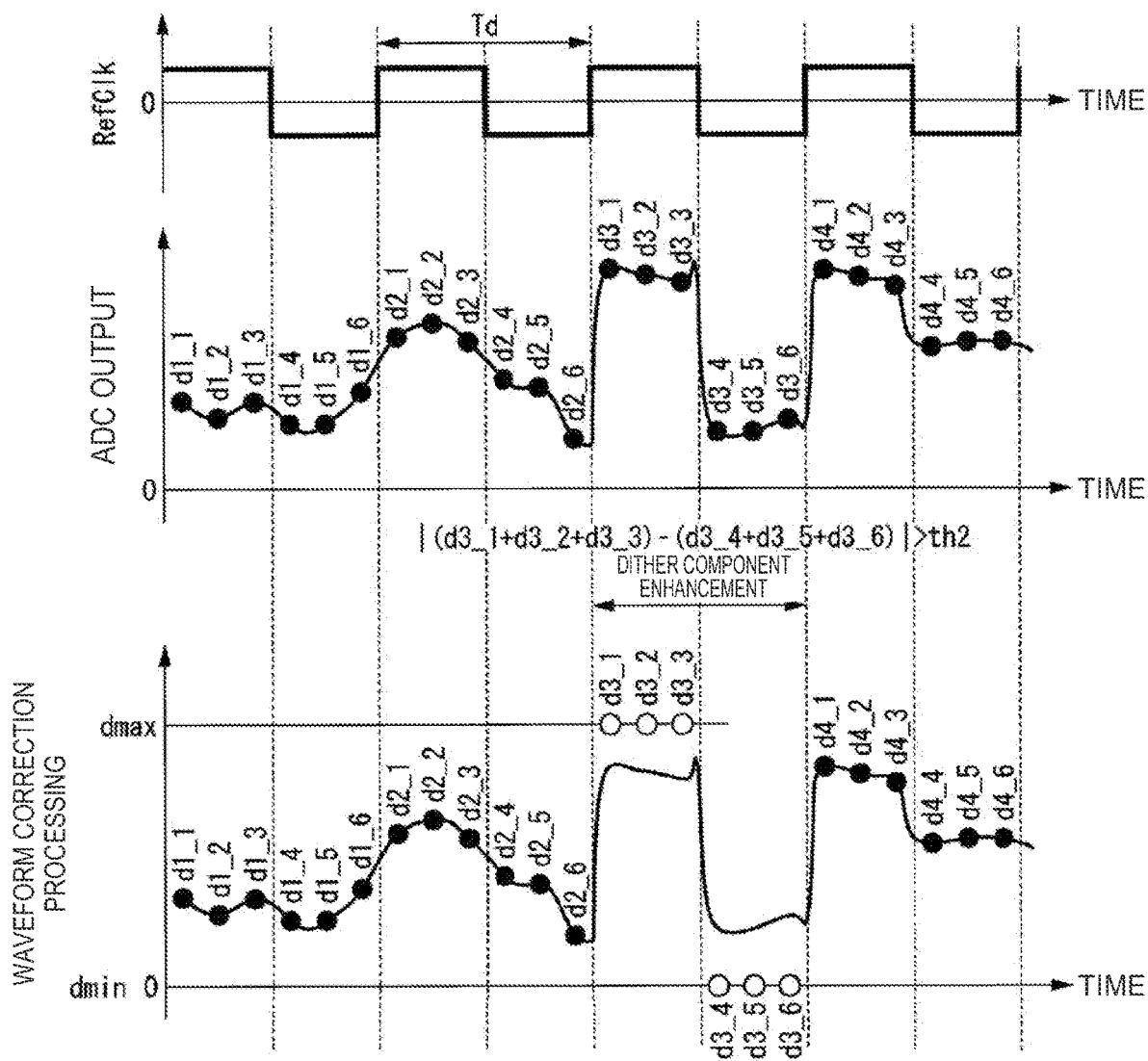
FIG. 4 is a diagram illustrating a second example of waveform correction in the first embodiment.

FIG. 4 is a diagram illustrating a second example of waveform correction in the first embodiment. FIG. 4 illustrates the reference clock (RefClk), the output from the ADC, and the waveform correction processing. A waveform illustrated at a middle part of FIG. 4 is an exemplary waveform of the output from the ADC 15. In sampled data in the range of the additional character "K=1" to "K=2", a low-frequency component having a large amplitude is superimposed as noise on the sampled data. However, the absolute value of sampled data "dK_L−dK_(L+1)" does not exceed the threshold value "th1" in the range of the additional character "K=1" to "K=2". Accordingly, the first condition is not satisfied.

In FIG. 4, the waveforms of sampled data have a large amount of noise, and thus it is difficult to determine that a dither component is detected in sampled data in the range of the additional character "K=1" to "K=2". At the middle part of FIG. 4, intensity change of sampled data of the additional character "K=3" has a strong correlation (correlation at a certain value or larger) with the reference clock. Accordingly, the second condition is satisfied, and thus it is determined that a dither component is detected. The dither component is enhanced (enlarged) by numerical calculation.

Before executing the calculation expressed in Expression (1), the waveform correction unit 106 derives "(dK_1+dK_2+dK_3)−(dK_4+dK_5+dK_6)" while changing the additional character "K". The first term "dK_1+dK_2+dK_3" is sampled data acquired in a duration in which the reference clock is a positive value. The second term "dK_4+dK_5+dK_6" is sampled data acquired in a duration in which the reference clock is a negative value.

The absolute value of sampled data of the additional character "K=1, 2, 4" is relatively small. However, the absolute value of sampled data of the additional character "K=3" is relatively large. When the absolute value of the difference between the sum value of sampled data acquired in a duration in which the reference clock is a positive value and the sum value of sampled data acquired in a duration in which the reference clock is a negative value exceeds a predetermined threshold value "th2" for sampled data of the additional character "K=3", the waveform correction unit 106 determines that a dither component is detected in sampled data of the additional character "K=3". In FIG. 4, "(d3_1+d3_2+d3_3)−(d3_4+d3_5+d3_6)>th2" holds.

When having determined that a dither component is detected in sampled data of the additional character "K=3", the waveform correction unit 106 enhances the dither component in sampled data of the additional character "K=3" through digital processing.

For example, the waveform correction unit 106 sets the value of the coefficient "W" in Expression (1) to be a value larger than one only for a case of the additional character "K=3", thereby enhancing, through digital processing, the dither component in sampled data acquired in the duration of the reference clock with the additional character "K=3".

For example, the waveform correction unit 106 may discard sampled data "d3_1, d3_2, d3_3" and update all pieces of sampled data "d3_1, d3_2, d3_3" to the same constant "dmax". The waveform correction unit 106 may discard sampled data "d3_4, d3_5, d3_6" and update all pieces of sampled data "d3_4, d3_5, d3_6" to the same constant "dmin". As illustrated with hollow circles at a lower part of FIG. 4, the constant "dmax" is larger than the constant "dmin". For example, the constant "dmax" may be the maximum value of the output from the ADC 15, and the constant "dmin" may be the minimum value of the output from the ADC 15 or zero.

When "(d3_1+d3_2+d3_3)−(d3_4+d3_5+d3_6)<(−th2)" holds and the dither component is enhanced by using the constant "dmax" and the constant "dmin", the waveform correction unit 106 changes sample data "d3_1, d3_2, d3_3" to the constant "dmin" and changes sample data "d3_4, d3_5, d3_6" to the constant "dmax".

Circuit noise randomly occurs. Thus, when the threshold value "th2" is too small, wrong determination is likely to occur, and the probability that the dither component is enlarged increases in the duration of a phase opposite to the phase of the reference clock. To lower the probability that the dither component is enlarged in the duration of the opposite phase, the value of the threshold value "th2" is set to a predetermined large value based on, for example, an experiment result.

Figure 15:
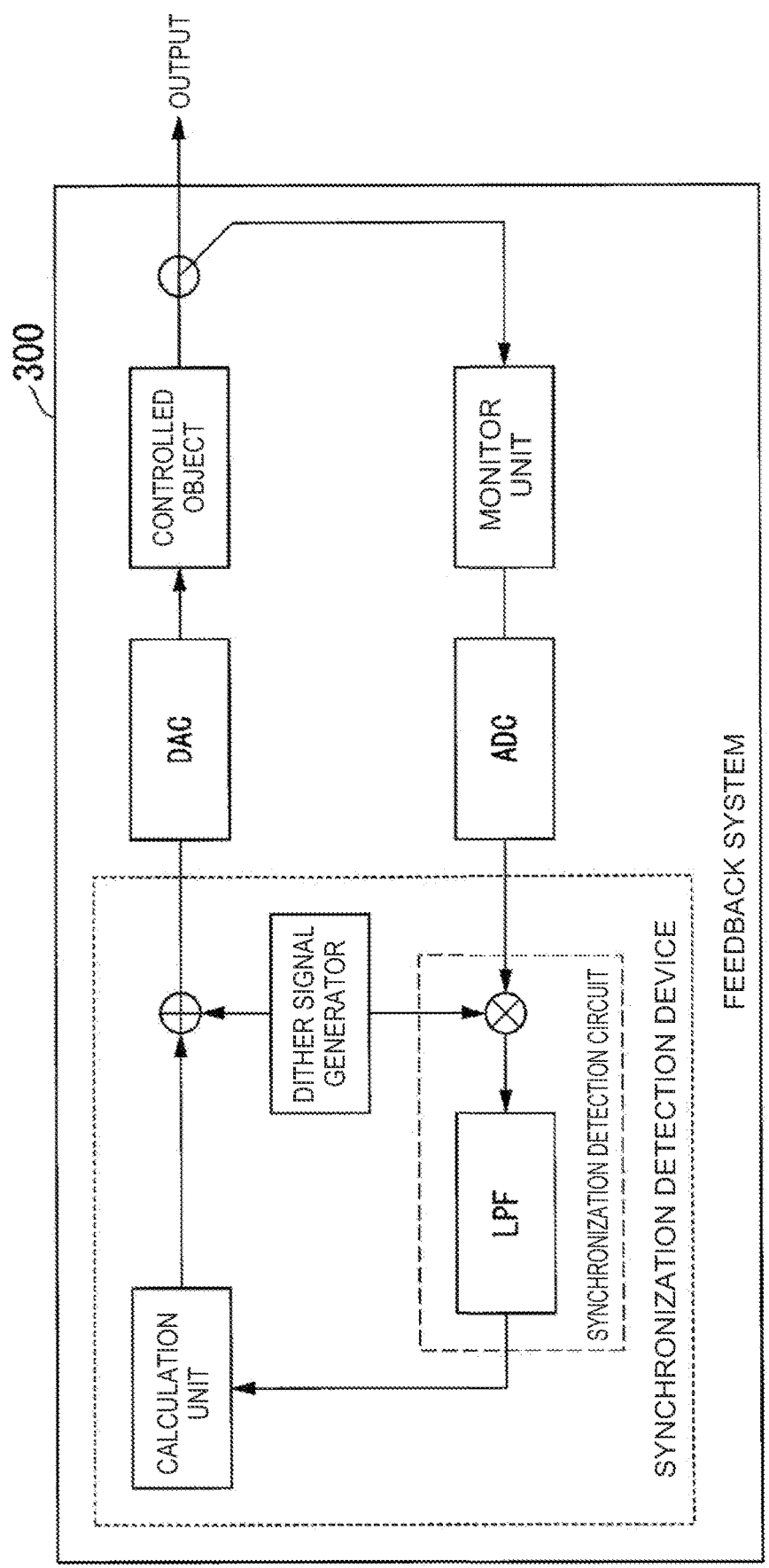
FIG. 15 is a diagram illustrating an exemplary configuration of the feedback system.

The averaging unit 402 of the waveform correction unit 106 executes the calculation expressed in Expression (1) on a result of the waveform correction processing. The calculation expressed in Expression (1) is averaging processing and is processing substantially equivalent to that of a low-pass filter. The result of the calculation expressed in Expression (1) is used as a synchronization detection signal. Since the calculation expressed in Expression (1) is executed by the waveform correction unit 106, the synchronization detection unit 104 may include no low-pass filter "LPF" as illustrated in FIG. 15.

The dither component is enlarged beyond the true value thereof through waveform correction based on the second condition, and thus the value of sampled data subjected to synchronization detection is larger than the true value of the output from the ADC 15. However, in feedback control, the phase (sign) of the synchronization detection result is more important than the magnitude of the absolute value of the synchronization detection result. Thus, the waveform correction based on the second condition is an effective method.

In this manner, the waveform correction unit 106 substitutes the predetermined integer "k" into the additional character "K" of sampled data "dK_L" and detects variation (intensity change) in "n×m" pieces of continuous sampled data "dk_1" to "dk_(n×m)". The waveform correction unit 106 derives a total (sum) "SumH" of all pieces of sampled data acquired in a duration in which the output from the reference signal generator is at a high level. The waveform correction unit 106 derives a total (sum) "SumL" of all pieces of sampled data acquired in a duration in which the output from the reference signal generator is at a low level. The waveform correction unit 106 derives the absolute value of the difference between "SumH" and "SumL". The waveform correction unit 106 activates a third flag (determination flag of the second condition) when the absolute value of the difference between "SumH" and "SumL" exceeds the second threshold value "th2". When the third flag is activated, the waveform correction unit 106 multiplies all "n×m" pieces of sampled data "dK_L" by a second positive weight coefficient or a second negative weight coefficient. Accordingly, the waveform correction unit 106 can execute the waveform correction processing of enhancing variation (dither component) having correlation or inverse correlation with dithering.

The waveform correction unit 106 may discard all "n×m" pieces of sampled data "dK_L" when the third flag is activated. The waveform correction unit 106 may generate, as the waveform correction processing, sampled data (for example, the value of "dmax" and the value of "dmin") in place of the discarded sampled data "dK_L". Accordingly, the waveform correction unit 106 can execute the waveform correction processing of enhancing variation (dither component) having correlation or inverse correlation with dithering.

In the first embodiment, with at least one of the first condition and the second condition as a determination reference, the waveform correction unit 106 can determine whether to execute waveform correction. When the waveform correction processing is executed by using both the first condition and the second condition, the first condition and the second condition simultaneously hold in some cases. In such a case, the waveform correction unit 106 may prioritize, for example, the first condition over the second condition.

Figure 5:
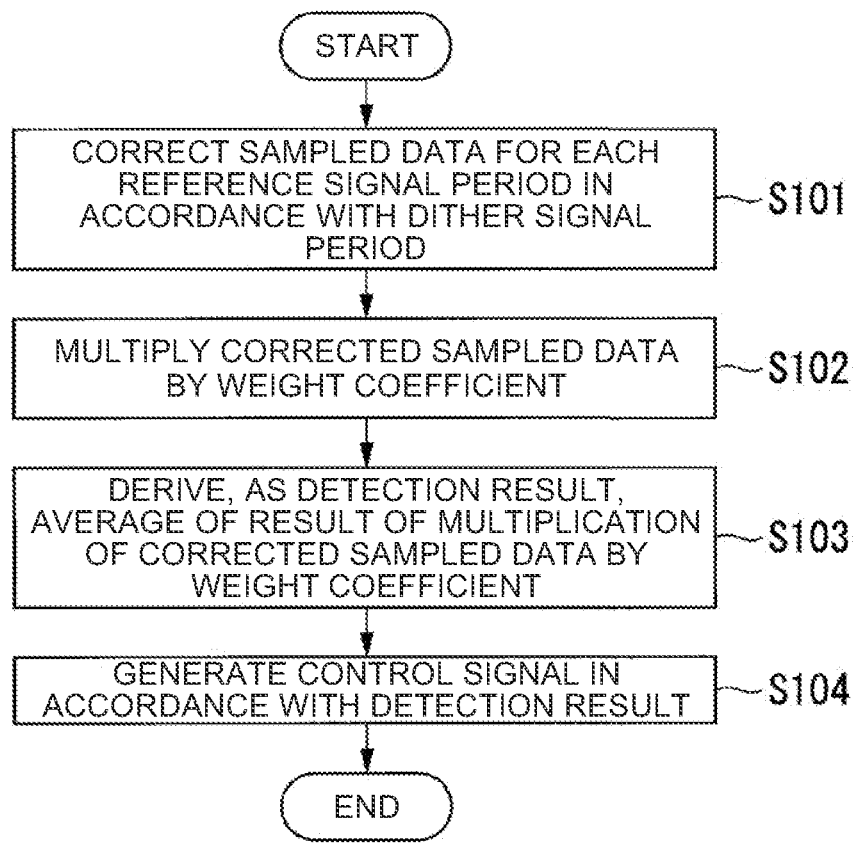
FIG. 5 is a flowchart illustrating exemplary operation of the synchronization detection device in the first embodiment.

Subsequently, exemplary operation of the feedback system 1a will be described below. FIG. 5 is a flowchart illustrating the exemplary operation of the feedback system 1a. The correction unit 400 of the waveform correction unit 106 corrects sampled data of a waveform (output from the monitor unit 14a) on which a dither signal is superimposed, for each period "Td/m" (m is a natural number and, for example, "3") of the reference clock (RefClk) in accordance with a period "Td" of the dither signal (step S101).

The multiplication unit 401 of the waveform correction unit 106 multiplies the corrected sampled data by a weight coefficient "W" that is different for each level of the reference clock and associated with the timing of the reference clock (step S102). The averaging unit 402 of the waveform correction unit 106 derives, as a detection result, the average of a result of the multiplication of the corrected sampled data by the weight coefficient (step S103). The calculation unit 100 generates a control signal in accordance with the detection result (step S104).

As described above, the synchronization detection device 10a of the first embodiment includes the waveform correction unit 106. The correction unit 400 of the waveform correction unit 106 corrects sampled data of a waveform (analog signal) on which a dither signal is superimposed, for each period "Td/m" of the reference clock (reference signal) in accordance with the period "Td" of the dither signal. The multiplication unit 401 of the waveform correction unit 106 multiplies the corrected sampled data by the weight coefficient "W" that is different for each level of the reference clock and associated with the timing of the reference clock. The averaging unit 402 of the waveform correction unit 106 derives, as a detection result, the average of a result of the multiplication of the corrected sampled data by the weight coefficient "W". The waveform correction unit 106 may reduce intensity change of the sampled data when intensity change uncorrelated with intensity change of the reference clock is detected in the output from the ADC 15 (sampled data). The waveform correction unit 106 may enhance the frequency component of the dither signal superimposed on the output from the ADC 15 when intensity change having correlation at a certain value or larger or inverse correlation with the reference signal is detected in the output from the ADC 15.

Accordingly, it is possible to reduce a processing time required for the accuracy of synchronization detection to be at certain accuracy or higher.

The dither signal generator 101a continuously generates a dither signal of the period "Td". The reference signal generator (output side of the dither signal generator 101a to the multiplier 103) generates a reference clock (reference signal). The reference clock has two states represented by a high level and a low level. The period of the reference clock is "Td/m" (m is a natural number). A data acquisition unit (the tap 13 and the multiplier 103) acquires a signal on which dithering is executed by the dither signal generator 101a. The data acquisition unit (ADC 15) samples, at a constant time interval "Td/(n×m)" over the time range of "p×Td", the signal on which dithering is executed by the dither signal generator 101a (signal on which a dither component is superimposed). The data acquisition unit (ADC 15) generates "p×n×m" pieces of sampled data. Among the "p×n×m" pieces of sampled data, the L-th (L is one to "n×m" inclusive) data obtained in the K-th (K is one to p inclusive) dithering period is denoted as "dK_L". The waveform correction unit 106 executes the waveform correction processing of "n×m" pieces of sampled data "dK_L" in the K-th dithering period before multiplication processing by a first positive weight coefficient or a first negative weight coefficient and processing of deriving the average of a result of the multiplication processing. When sampled data "dK_L" is sampled at a time when the reference clock (RefClk) is at the high level, the waveform correction unit 106 (data processing circuit) multiplies sampled data "dK_L" having the corrected waveform by the first positive weight coefficient. When sampled data "dK_L" is sampled at a time when the reference clock is at the low level, the waveform correction unit 106 multiplies sampled data "dK_L" having the corrected waveform by the first negative weight coefficient. The waveform correction unit 106 executes averaging processing of deriving the average of the result of the multiplication processing and outputs a result of the execution of the averaging processing as a synchronization detection result.

Second Embodiment

A second embodiment is different from the first embodiment in that a dither component of not the frequency "fd" but of the m-th (m is an odd natural number) order harmonic "m×fd" is subjected to synchronization detection. In the second embodiment, difference from the first embodiment will be described.

The third condition as a reference of determination whether to execute waveform correction is such a condition that intensity change inconsistent with a sign pattern (positive and negative pattern) of the reference clock is detected in the output from the ADC 15 or the controlled object 12. Intensity change inconsistent with the sign pattern of the reference clock can be determined as not a dither component but noise. The synchronization detection device 10a reduces the intensity change (noise) through digital processing before the multiplication processing is executed.

Figure 6:
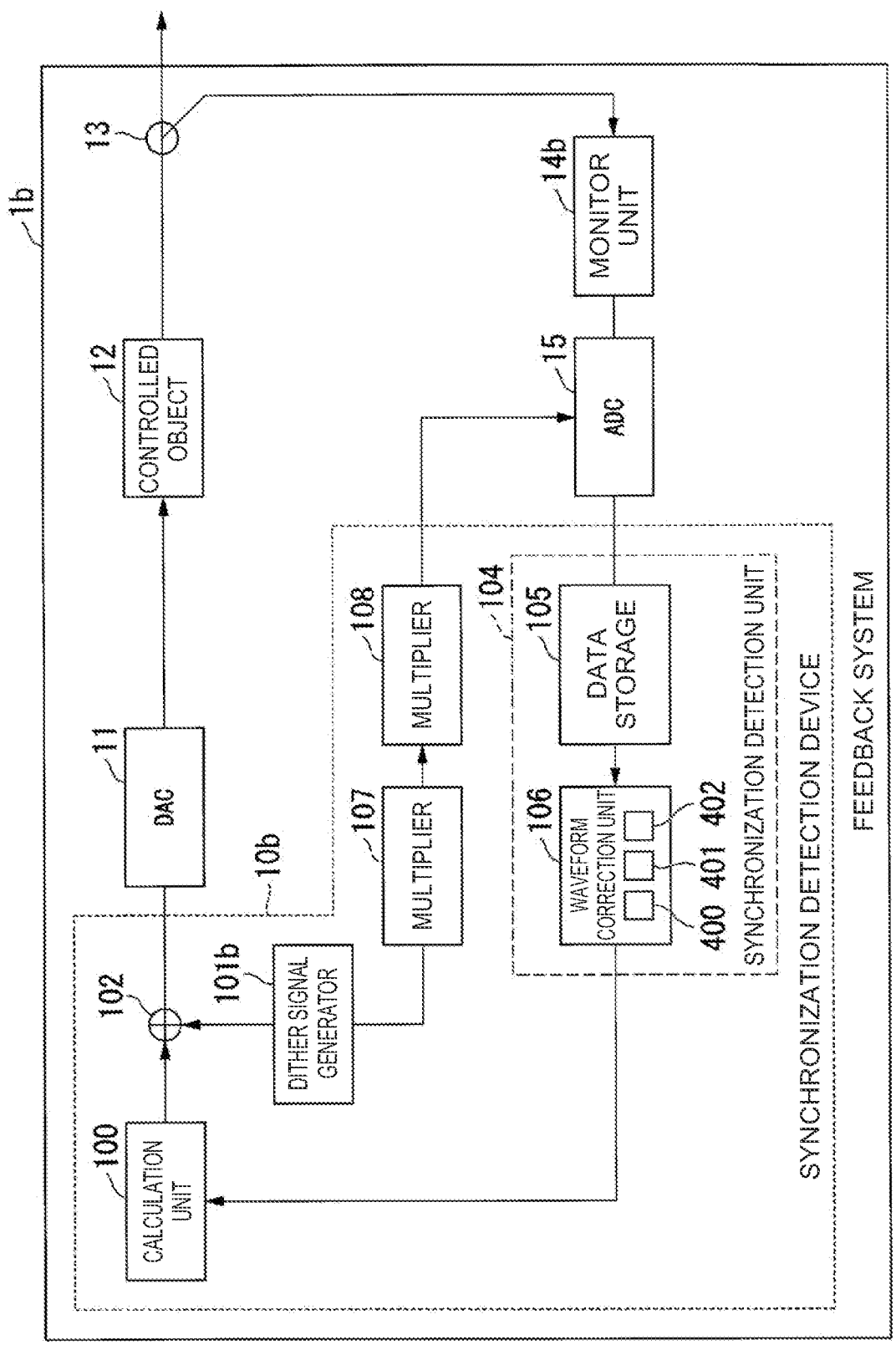
FIG. 6 is a diagram illustrating an exemplary configuration of a feedback system in a second embodiment.

FIG. 6 is a diagram illustrating an exemplary configuration of a feedback system 1b. The feedback system 1b includes a synchronization detection device 10b, the DAC 11, the controlled object 12, the tap 13, a monitor unit 14b, and the ADC 15. The synchronization detection device 10b includes the calculation unit 100, a dither signal generator 101b, the addition unit 102, a multiplier 107, a multiplier 108, and the synchronization detection unit 104.

When the level of signal delay is not negligible, the synchronization detection device 10b may include a delay circuit for skew compensation between the dither signal generator 101b and the multiplier 107. The synchronization detection device 10b may include a delay circuit for skew compensation between the multiplier 107 and the multiplier 108.

The multiplier 107 acquires the reference clock of the frequency "fd" from the dither signal generator 101b. The multiplier 107 performs "n"-multiplication of the reference clock of the frequency "fd" (=1/Td) generated by the dither signal generator 101b.

The multiplier 108 acquires the reference clock of the frequency "fd" subjected to the "n"-multiplication from the multiplier 107. The multiplier 108 performs "m"-multiplication of the reference clock of a frequency "n×fd" generated by the multiplier 108. The multiplier 108 outputs the reference clock of a frequency "n×m×fd" to the ADC 15.

The monitor unit 14b detects the m-th order harmonic of the dither component in the output from the controlled object 12. The sampling rate by the ADC 15 is equal to a value (=n×m×fd) "n" times larger than "m×fd".

In the first embodiment, a square wave is used as a dither signal. Thus, not only the dither component of the frequency "fd" but also the m-th order (odd-ordered) harmonic component are superimposed on the output from the controlled object 12 in the first embodiment.

In the second embodiment, when it is difficult to detect the dither component of the frequency "fd" attributable to circuit noise or the like, the synchronization detection device 10b performs synchronization detection of the m-th order harmonic and executes feedback control. When the output from the controlled object 12 has some non-linearity, occurrence of a high-order component (including not only an odd-ordered component but also an even-ordered component) is more significant than occurrence of the frequency component of the dither component in the output from the ADC 15 in some cases. In such a case, the synchronization detection device 10b may perform synchronization detection of the m-th order harmonic and execute feedback control.

Figure 7:
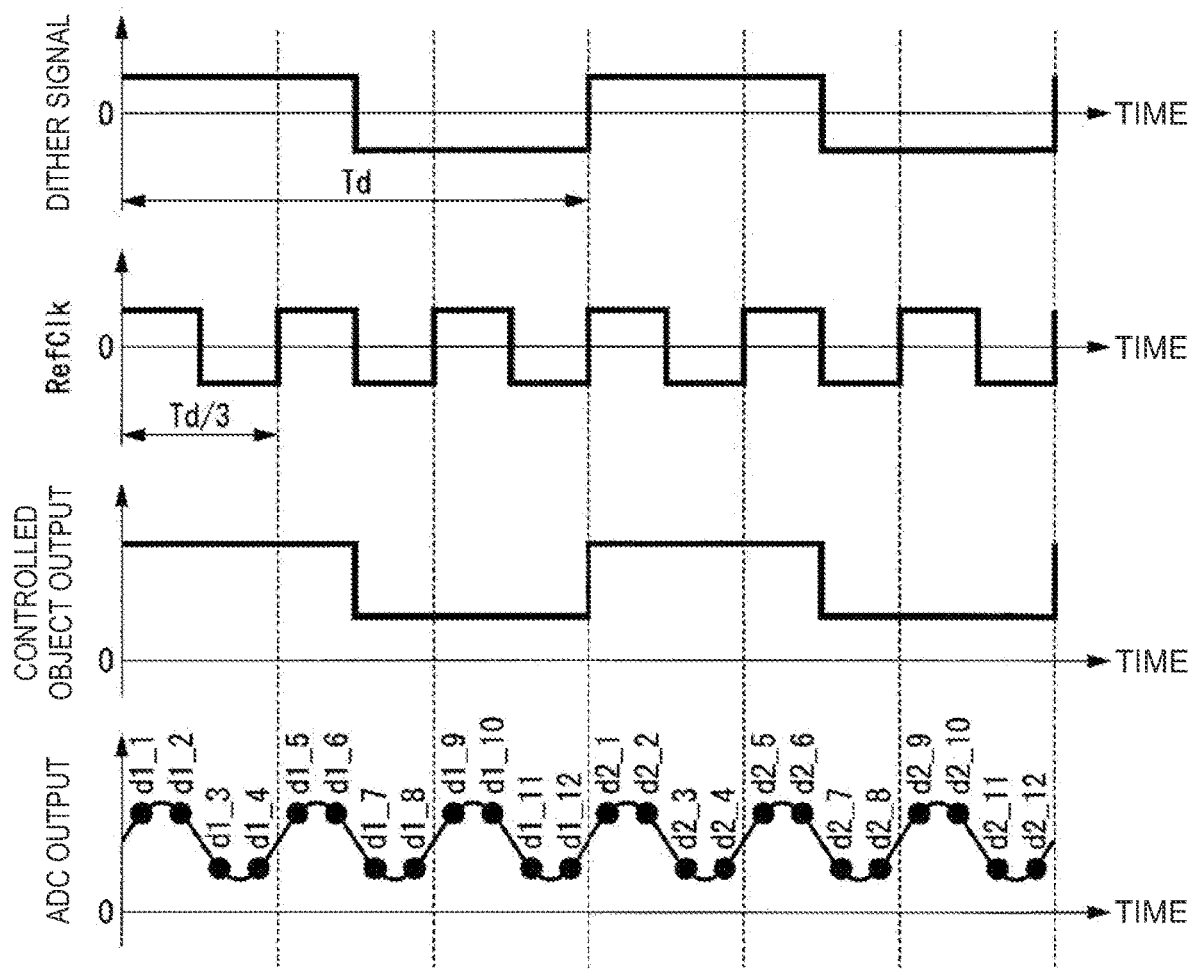
FIG. 7 is a diagram illustrating an exemplary dither signal, an exemplary reference clock, an exemplary output from a controlled object, and an exemplary output from an ADC in the second embodiment.

FIG. 7 is a diagram illustrating an exemplary dither signal, an exemplary reference clock (RefClk), an exemplary output from the controlled object, and an exemplary output from the ADC 15. FIG. 7 is intended to indicate a relative phase relation and thus does not illustrate noise. The time interval of sampling by the ADC 15 is "Td/(m×n)=Td/12". In the expression, "m" is three and "n" is four. In the second embodiment, the value of the additional character "L" is 1 to 12. In FIG. 7, similarly to the case of "A" illustrated in FIG. 18, the phase of the reference clock and the phase of the output from the ADC 15 are substantially in phase.

In the second embodiment, the value of the additional character "K" of sampled data "dK_L" is one to p. The value of the additional character "L" is 1 to 12. The multiplier 107 generates a reference clock of a frequency "3fd". The multiplier 108 performs four-times multiplication of the reference clock of the frequency "3fd". The multiplier 108 generates a reference clock of a frequency "12fd" as a data sampling clock.

The dither component of the frequency "fd" is superimposed on the output from the controlled object 12. Since the waveform of the output from the controlled object 12 is a square wave, the third-order harmonic of the dither component is also superimposed on the output from the controlled object 12. The monitor unit 14b detects the dither component in the output from the controlled object 12. The monitor unit 14b outputs the detected dither component to the ADC 15. The monitor unit 14b may detect the third-order harmonic of the dither component in the output from the controlled object 12. The monitor unit 14b may output the third-order harmonic of the dither component to the ADC 15.

The data storage 105 stores sampled data. When "12×p" pieces of sampled data as sampled data corresponding to the "p" periods of the reference clock are stored in the data storage 105, the data storage 105 outputs the sampled data corresponding to the "p" periods to the waveform correction unit 106.

The data storage 105 deletes, in the data storage 105, the sampled data corresponding to the "p" periods and output to the waveform correction unit 106. The data storage 105 stores "12×p" pieces of sampled data as sampled data corresponding to the next "p" periods of the reference clock.

The sampling by the ADC 15 is synchronized with the reference clock. Thus, the waveform correction unit 106 can identify whether each piece of sampled data "dK_1" to "dK_12" is sampled data acquired in a duration in which the reference clock is a positive value or sampled data acquired in a duration in which the reference clock is a negative value.

In the second embodiment, sampled data of the additional character "L" of "1" to "6" is sampled data acquired in a duration in which the reference clock is a positive value. Sampled data of the additional character "L" of "7" to "12" is sampled data acquired in a duration in which the reference clock is a negative value.

In the second embodiment, Expression (1) in the first embodiment is expressed as Expression (2). The waveform correction unit 106 executes calculation (averaging processing) expressed in Expression (2) after the waveform correction processing. In Expression (2), "Σ" represents a sum over "K=1" to "K=p".

$$\Sigma\{(dK\_1+dK\_2+dK\_5+dK\_6+dK\_9+dK\_10-dK\_3-dK\_4-dK\_7-dK\_8-dK\_11-dK\_12)\times W\}/(12\times p) \quad (2)$$

Figure 8:
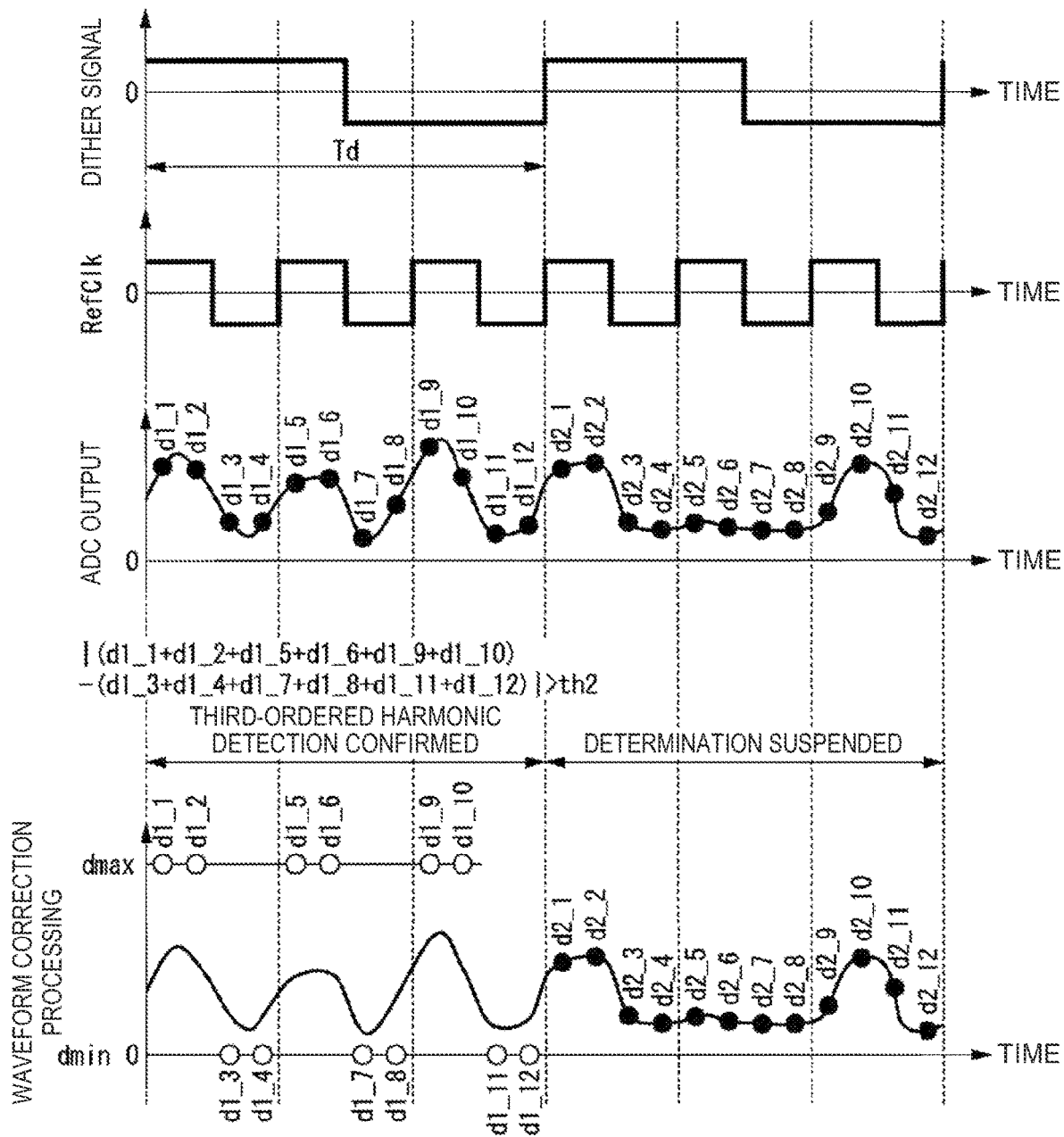
FIG. 8 is a diagram illustrating a first example of waveform correction in the second embodiment.

FIG. 8 is a diagram illustrating first example of waveform correction in the second embodiment. FIG. 8 illustrates the reference clock (RefClk), the output from the ADC, and the waveform correction processing. The waveform correction unit 106 can execute waveform correction using the second condition. Before executing the calculation expressed in Expression (2), the waveform correction unit 106 derives the value of Expression (3) for each additional character "K".

$$(dK\_1+dK\_2+dK\_5+dK\_6+dK\_9+dK\_10)-(dK\_3+dK\_4+dK\_7+dK\_8+dK\_11+dK\_12) \quad (3)$$

The first term "dK_1+dK_2+dK_5+dK_6+dK_9+dK_10" is sampled data acquired in a duration in which the reference clock is a positive value. The second term "dK_3+dK_4+dK_7+dK_8+dK_11+dK_12" is sampled data acquired in a duration in which the reference clock is a negative value.

The absolute value of the difference between the sum value of sampled data acquired in a duration in which the reference clock is a positive value and the sum value of sampled data acquired in a duration in which the reference clock is a negative value exceeds the threshold value "th2" for sampled data "d1_L" of the additional character "K=1". When the absolute value of the difference between the sum values is exceeds the predetermined threshold value "th2", the second condition is satisfied, and thus the waveform correction unit 106 determines that a dither signal (third-order harmonic) subjected to three-times multiplication is detected.

The waveform correction unit 106 may discard sampled data of the additional character "K=1" and update all pieces of sampled data "d1_L" of the additional character "K=1" to the same constant "dmax". The waveform correction unit 106 may discard sampled data of "d1_L" and update all pieces of sampled data of "d1_L" to the same constant "dmin". As illustrated with hollow circles at a lower part of FIG. 8, the constant "dmax" is larger than the constant "dmin". In FIG. 8, the value of the coefficient "W" in Expression (2) may be unchanged from the initial value "1".

The absolute value of the difference between the sum value of sampled data acquired in a duration in which the reference clock is a positive value and the sum value of sampled data acquired in a duration in which the reference clock is a negative value does not exceed the threshold value "th2" for sampled data "d2_L" of the additional character "K=2". When the absolute value of the difference between the sum values does not exceed the predetermined threshold value "th2", the second condition is not satisfied, and thus the waveform correction unit 106 does not determine that the third-order harmonic is detected, but suspends the determination. The waveform correction unit 106 directly substitutes sampled data "d2_L" into Expression (2) without executing the waveform correction processing.

Figure 9:
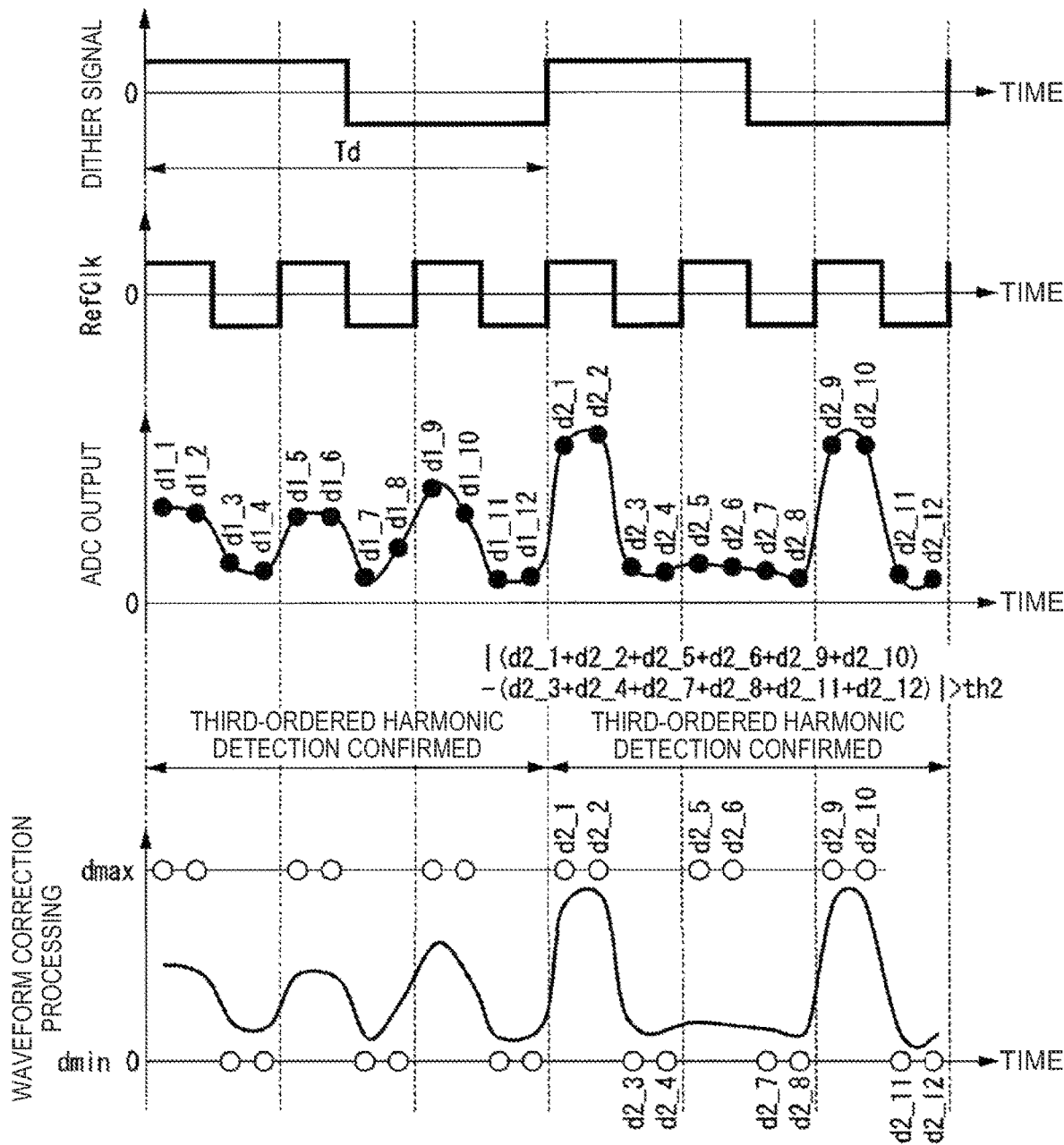
FIG. 9 is a diagram illustrating a second example of waveform correction in the second embodiment.

FIG. 9 is a diagram illustrating second example of waveform correction in the second embodiment. FIG. 9 illustrates the reference clock (RefClk), the output from the ADC, and the waveform correction processing. In sampled data "d1_L" of the additional character "K=1", the amplitude of the waveform of the output from the ADC 15 illustrated in FIG. 9 is the same as the amplitude of the waveform of the output from the ADC 15 illustrated in FIG. 8. However, in sampled data "d2_1, d2_2, d2_9, d2_10" among sampled data "d2_L" of the additional character "K=2", the amplitude of the waveform of the output from the ADC 15 illustrated in FIG. 9 is larger than the amplitude of the waveform of the output from the ADC 15 illustrated in FIG. 8.

The absolute value of the difference between the sum value of sampled data acquired in a duration in which the reference clock is a positive value and the sum value of sampled data acquired in a duration in which the reference clock is a negative value exceeds the threshold value "th2" for sampled data "d1_L".

The absolute value of the difference between the sum value of sampled data acquired in a duration in which the reference clock is a positive value and the sum value of sampled data acquired in a duration in which the reference clock is a negative value exceeds the threshold value "th2" for the absolute value of sampled data "d2_L".

When the absolute value of the difference between the sum values exceeds the predetermined threshold value "th2", the second condition is satisfied, and thus the waveform correction unit 106 determines that a dither signal (third-order harmonic) subjected to three-times multiplication is detected.

The waveform correction unit 106 may discard sampled data of the additional character "K=1" and update all pieces of sampled data "d1_L" of the additional character "K=1" to the same constant "dmax". The waveform correction unit 106 may discard sampled data "d1_L" and update all pieces of sampled data "d1_L" to the same constant "dmin". The same applies to sampled data "d2_L".

The values of sampled data "d2_5" and "d2_6" are smaller than the constant "dmax" before the waveform correction processing is executed. However, the waveform correction unit 106 corrects the values of sampled data "d2_5" and "d2_6" with the constant "dmax" through the waveform correction processing. Such correction is appropriate because of the following reason.

The waveform correction unit 106 identifies 12 pieces of sampled data acquired in the duration of the additional character "K=2" as a high level "Hi" or a low level "Lo" by using a threshold value.

When the threshold value is the median of the output from the ADC 15 in FIG. 9, the output ("d2_1" to "d2_12") from the ADC 15 acquired in the duration of the additional character "K=2" is identified as "Hi-Hi-Lo-Lo-Lo-Lo-Lo-Lo-Hi-Hi-Lo-Lo". In theory, a mark rate (probability of appearance of "Hi") of a dither signal (third-order harmonic) subjected to three-times multiplication is 0.5. Thus, it is clear that the identification result "Hi-Hi-Lo-Lo-Lo-Lo-Lo-Lo-Hi-Hi-Lo-Lo" is error. However, first interpretation or second interpretation holds for this identification result error.

First Interpretation

The identification result is error for "d2_5" and "d2_6" because the correct identification result is "Hi-Hi-Lo-Lo-Hi-Hi-Lo-Lo-Hi-Hi-Lo-Lo".

Second Interpretation

The identification result is error except for "d2_5" and "d2_6" because the correct identification result is "Lo-Lo-Hi-Hi-Lo-Lo-Hi-Hi-Lo-Lo-Hi-Hi".

The probability that the first interpretation is correct is probabilistically higher than the probability that the second interpretation is correct, and thus the waveform correction unit 106 estimates the identification result to be "Hi-Hi-Lo-Lo-Hi-Hi-Lo-Lo-Hi-Hi-Lo-Lo". Accordingly, the waveform correction unit 106 corrects the values of sampled data "d2_5" and "d2_6" with the constant "dmax" through the waveform correction processing.

The identification result of the first interpretation may possibly be error. Thus, the threshold value "th2" is set to be such a large value that the number of occurrences of wrong determination is negligibly small.

Figure 10:
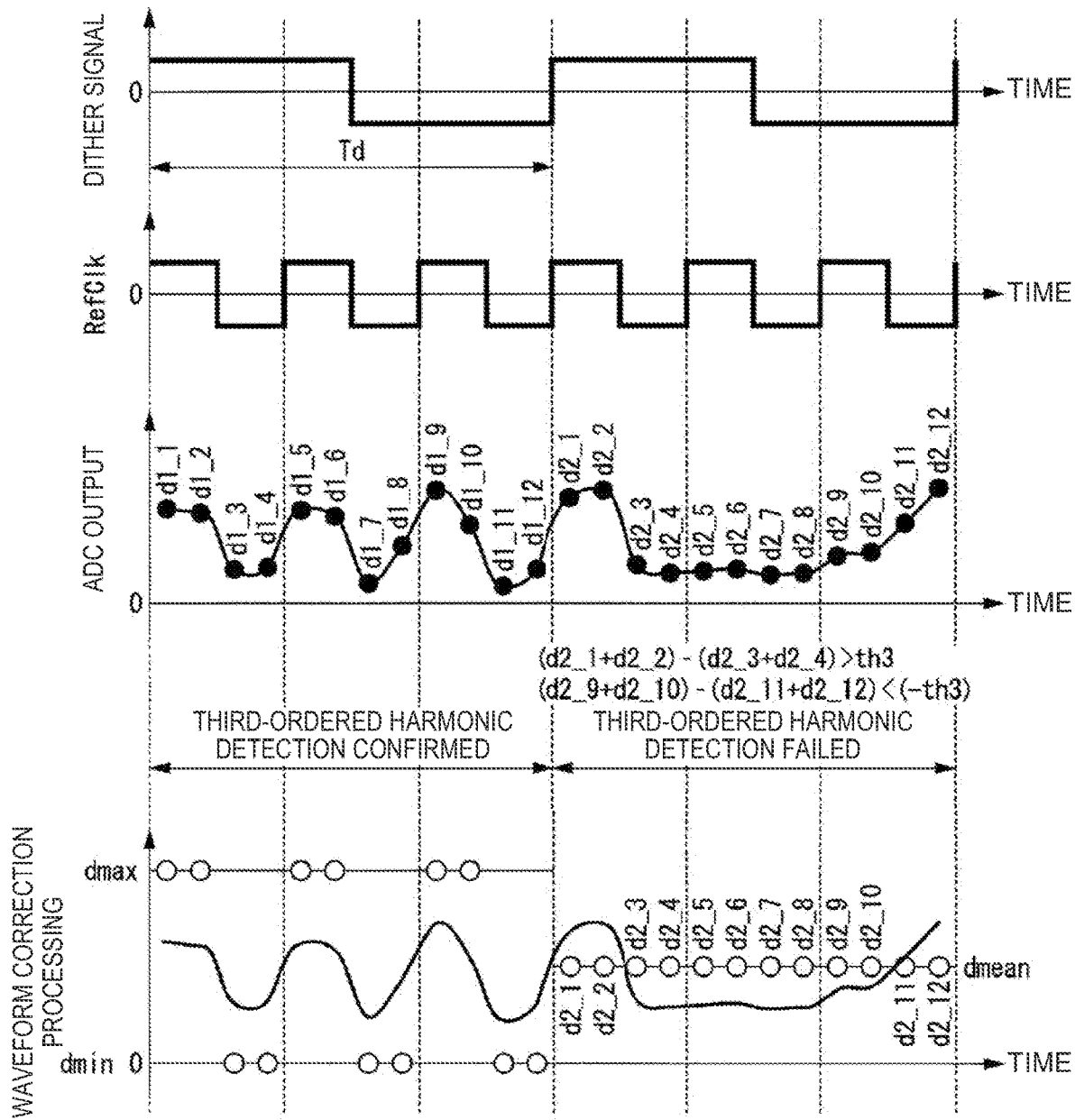
FIG. 10 is a diagram illustrating a third example of waveform correction in the second embodiment.

FIG. 10 is a diagram illustrating a third example of waveform correction in the second embodiment. FIG. 10 illustrates the reference clock (RefClk), the output from the ADC, and the waveform correction processing. In sampled data "d1_L" of the additional character "K=1", the waveform of the output from the ADC 15 illustrated in FIG. 10 is the same as the waveform of the output from the ADC 15 illustrated in FIG. 8. In sampled data "d2_L" of the additional character "K=2", monotonically increasing noise is superimposed on the waveform of the output from the ADC 15 illustrated in FIG. 10.

Before executing the calculation expressed in Expression (2), the waveform correction unit 106 derives the difference between the sum value of the output from the ADC 15 before the sign of the reference clock is switched and the sum value of the output from the ADC 15 after the sign of the reference clock is switched. In other words, the waveform correction unit 106 derives the difference between the sum value of pieces of sampled data in a duration in which the reference clock is a positive value and the sum value of pieces of sampled data in a duration in which the reference clock is a negative value.

The value "(d1_1+d1_2)−(d1_3+d1_4)" is positive for sampled data "d1_L" of the additional character "K=1". The value "(d1_5+d1_6)−(d1_7+d1_8)" is positive. The value "(d1_9+d1_10)−(d1_11+d1_12)" is positive.

The value "(d2_1+d2_2)−(d2_3+d2_4)" is positive for sampled data "d2_L" of the additional character "K=2". The value "(d2_5+d2_6)−(d2_7+d2_8)" is close to zero, and thus the sign of "(d2_5+d2_6)−(d2_7+d2_8)" is unclear. The value "(d2_9+d2_10)−(d2_11+d2_12)" is negative.

In the duration of "L=1" to "L=4" in sampled data "d2_L" of the additional character "K=2", the waveform correction unit 106 determines that the phase of the reference clock and the phase of the output from the ADC 15 are substantially in phase. In the duration of "L=5" to "L=8", it is difficult to determine whether the third-order harmonic is detected, and thus the waveform correction unit 106 suspends the determination. In the duration of "L=9" to "L=12", the waveform correction unit 106 determines that the phase of the reference clock and the phase of the output from the ADC 15 are in opposite phase.

These determination results are mutually inconsistent. Specifically, intensity change inconsistent with the sign pattern of the reference clock is detected in the output from the ADC 15. Thus, for sampled data "d2_L" of the additional character "K=2", the third condition is satisfied, and the waveform correction unit 106 determines that detection of the third-order harmonic has failed.

The waveform correction unit 106 obtains a result "(d2_1+d2_2)−(d2_3+d2_4)>th3" by using a predetermined threshold value "th3". The sign of the sum value difference "(d2_1+d2_2)−(d2_3+d2_4)" is positive. The waveform correction unit 106 obtains a result "|(d2_5+d2_6)−(d2_7+d2_8)|<th3" by using the predetermined threshold value th3 and suspends determination. The waveform correction unit 106 obtains a result "(d2_9+d2_10)−(d2_11+d2_12)<(−th3)" by using the predetermined threshold value "th3". The sign of the sum value difference "(d2_9+d2_10)−(d2_11+d2_12)" is negative.

The absolute value of a first sum value difference exceeds the predetermined threshold value "th3", the absolute value of a second sum value difference exceeds the predetermined threshold value "th3", and the sign of the first sum value difference and the sign of the second sum value difference are opposite to each other. Thus, the waveform correction unit 106 determines that the third condition is satisfied.

When having determined that the third condition is satisfied in the duration (period "Td") of the reference clock with the additional character "K=2", the waveform correction unit 106 executes no synchronization detection processing on sampled data acquired in the duration of the reference clock with the additional character "K=2". For example, only for "K=2", the waveform correction unit 106 executes no synchronization detection processing on sampled data acquired in the duration of the reference clock with the additional character "K=2" by setting the value of the coefficient "W" in Expression (2) to be zero. Except for the additional character "K=2", the waveform correction unit 106 sets the value of the coefficient "W" in Expression (2) to be one.

Only for "K=2", the waveform correction unit 106 may discard sampled data "d2_1" to "d2_12". Only for "K=2", the waveform correction unit 106 may update all pieces of sampled data "d2_1" to "d2_12" to the same value (for example, the average value of the sampled data) as illustrated with hollow circles at a lower part of FIG. 10.

The waveform correction unit 106 executes the calculation expressed in Expression (2) on a result of the waveform correction processing. Accordingly, similarly to the first embodiment, the waveform correction unit 106 derives a synchronization detection result.

In the second embodiment, with at least one of the first condition, the second condition, and the third condition as a determination reference, the waveform correction unit 106 determines whether to execute waveform correction. When the waveform correction processing is executed by using at least one of the first condition and the third condition and using the second condition, at least one of the first condition and the third condition holds simultaneously with the second condition in some cases. In such a case, the waveform correction unit 106 may prioritize the first condition or the third condition over the second condition (condition for processing of enhancing the dither component). The contents of the waveform correction processing are same for the first condition and the third condition, and thus the result of the waveform correction processing does not change whether determination of the first condition or the third condition is prioritized.

As described above, when intensity change inconsistent with the sign pattern of the reference clock (reference signal) is detected in the output from the ADC 15, the waveform correction unit 106 of the second embodiment may reduce the intensity change.

Accordingly, it is possible to reduce a processing time required for the accuracy of synchronization detection to be at certain accuracy or higher.

The dither signal generator 101b continuously generates a dither signal of the period "Td". The reference signal generator (output side of a dither signal generator 101c to the multiplier 107) generates a reference clock (reference signal). In the period "Td" of the dither signal, "q (q is a natural number equal to or larger than one)" high-level durations and "q" low-level durations exist in the output from the reference signal generator (reference clock). The waveform correction unit 106 substitutes the predetermined integer "k" into the additional character "K" of sampled data "dK_L" and detects variation (intensity change) of "n×m" pieces of continuous sampled data "dk_1" to "dk_(n×m)". The waveform correction unit 106 derives q first sum values ("SumH1" to "SumHq") each indicating the sum of sampled data acquired for the corresponding duration in which the output from the reference signal generator is at a high level. The waveform correction unit 106 derives q second sum values ("SumL1" to "SumLq") each indicating the sum of sampled data acquired for the corresponding duration in which the output from the reference signal generator is at a low level. The waveform correction unit 106 derives the absolute value of the difference between a first sum value and a second sum value (for example, SumH1 and SumL1) of adjacent durations among the q first sum values ("SumH1" to "SumHq") and the q second sum values ("SumL1" to "SumLq"). When a plurality of durations for which the absolute value of the difference between a first sum value and a second sum value of adjacent durations exceeds the third threshold value "th3" exist in the period "Td" of the dither signal, the waveform correction unit 106 determines whether the magnitude relation between the first sum value and the second sum value of adjacent durations is correlated or inversely correlated with the magnitude relation of the output from the reference signal generator. When the magnitude relation between the first sum value and the second sum value of adjacent durations is not correlated or inversely correlated with the magnitude relation of the output from the reference signal generator, the waveform correction unit 106 activates a fourth flag (determination flag of the third condition). When the fourth flag is activated, the waveform correction unit 106 determines that "n×m" pieces of sampled data "dK_L" are not a dither component but noise. Sampled data "dK_L" determined as noise is not used for synchronization detection. The waveform correction unit 106 may generate, as the waveform correction processing, sampled data (for example, the value of "dmax" and the value of "dmin") in place of sampled data "dK_L" determined as noise.

Third Embodiment

A third embodiment is different from the first and second embodiments in that the output from the dither signal generator is not a signal (alternating signal) alternately having a positive value and a negative value but is a signal repeating a specific pattern. In the third embodiment, difference from the first and second embodiments will be described.

Figure 11:
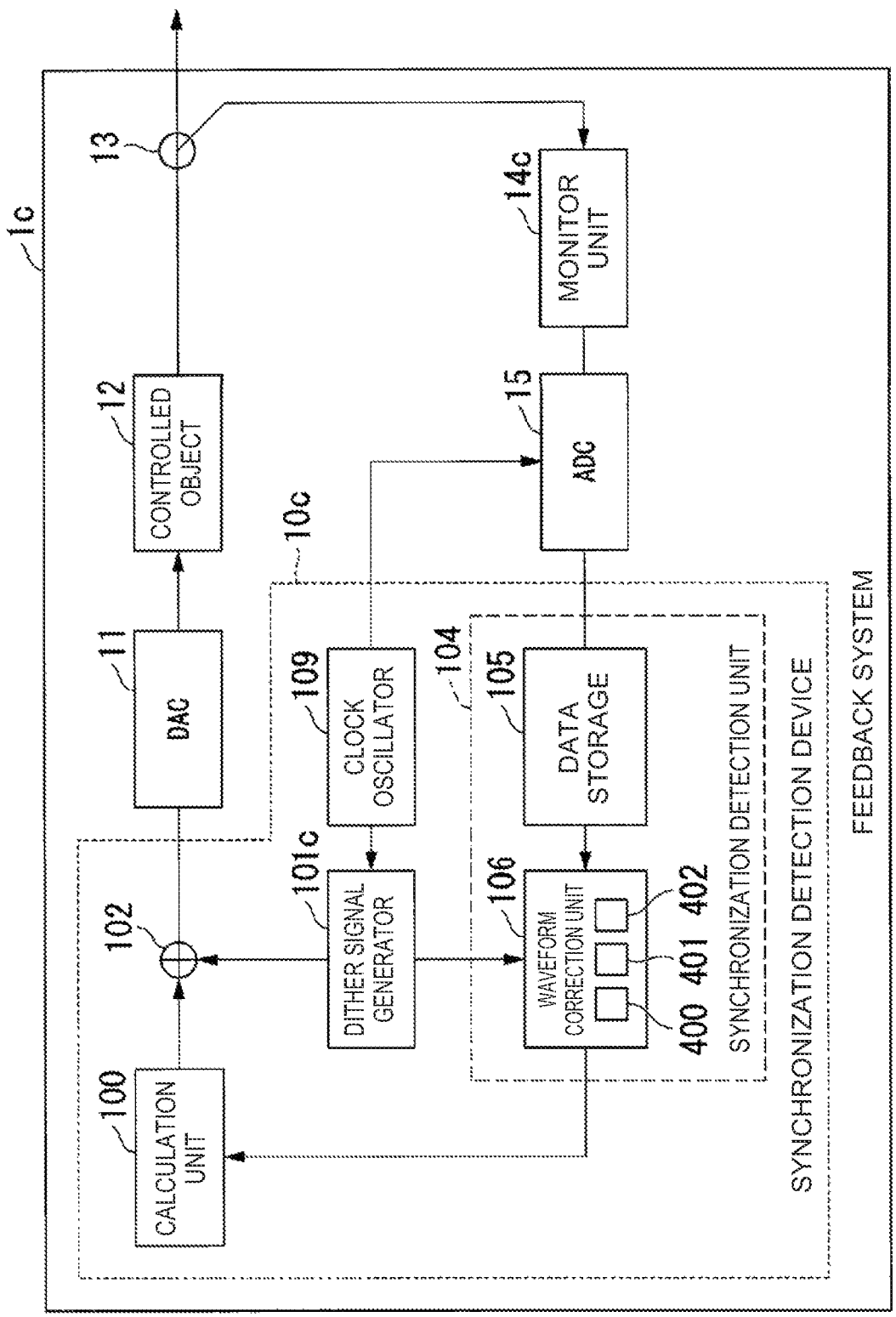
FIG. 11 is a diagram illustrating an exemplary configuration of a feedback system in a third embodiment.

FIG. 11 is a diagram illustrating an exemplary configuration of a feedback system 1c. The feedback system 1c includes a synchronization detection device 10c, the DAC 11, the controlled object 12, the tap 13, a monitor unit 14c, and the ADC 15. The synchronization detection device 10c includes the calculation unit 100, the dither signal generator 101c, the addition unit 102, the multiplier 103, the synchronization detection unit 104, and a clock oscillator 109.

When the level of signal delay is not negligible, the synchronization detection device 10c may include a delay circuit for skew compensation between the clock oscillator 109 and the ADC 15.

The clock oscillator 109 generates a clock signal of a frequency "8×fd". The clock oscillator 109 outputs the clock signal of the frequency "8×fd" to the dither signal generator 101c and the ADC 15.

The dither signal generator 101c generates a signal (RefPattern) indicating the pattern of a dither signal by using the clock of the frequency "8×fd". The dither signal generator 101c outputs a signal indicating the pattern of the dither signal to the addition unit 102 and the waveform correction unit 106. The dither signal generator 101c outputs the dither signal to the addition unit 102. The dither signal generator 101c outputs the signal indicating the pattern of the dither signal to the waveform correction unit 106.

The monitor unit 14c detects a dither component in the output from the controlled object 12. The ADC 15 determines the timing of sampling of the dither component by using the clock of the frequency "8×fd". The number of times of sampling by the ADC 15 is eight per period "Td". When executing the synchronization detection processing, the waveform correction unit 106 uses, as a reference signal, the signal indicating the pattern of the dither signal.

The output (dither signal) from the dither signal generator 101c is a signal repeating a specific pattern. The specific pattern is repeated in the period "Td". To avoid complication of the synchronization detection processing, the number of positive-value durations and the number of negative-value durations may be equal to each other.

Figure 12:
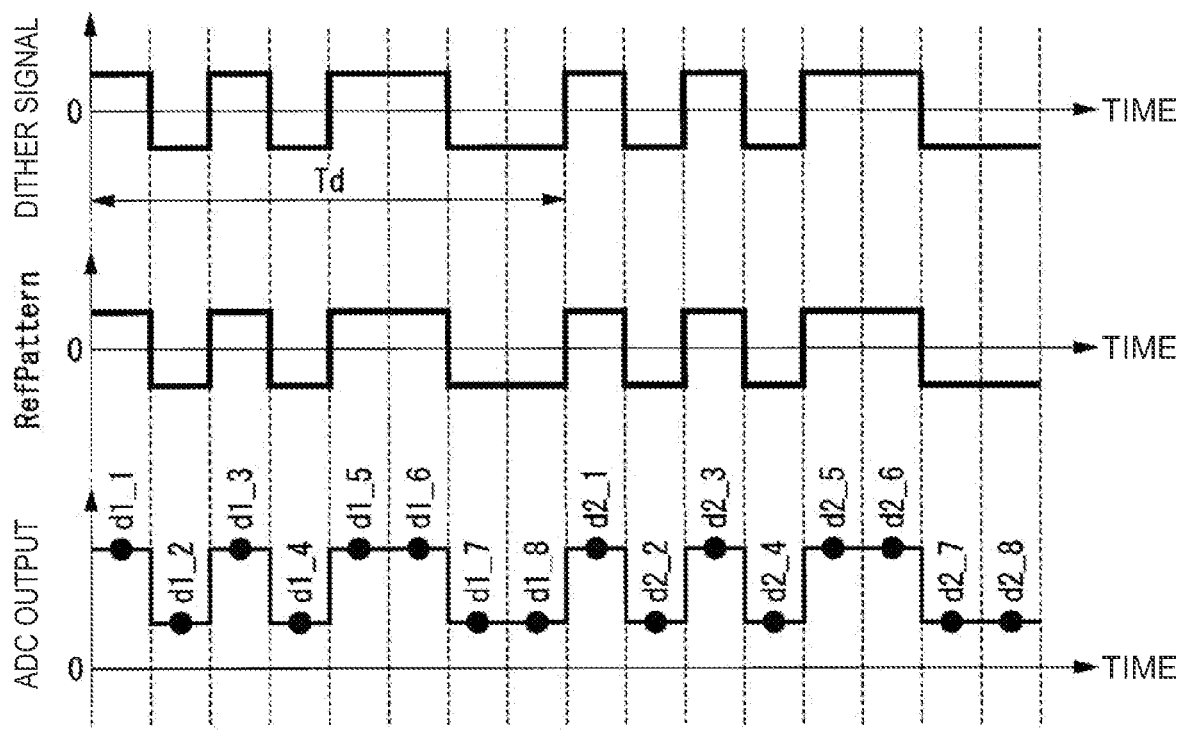
FIG. 12 is a diagram illustrating an exemplary dither signal, an exemplary signal indicating the pattern of the dither signal, and an exemplary output from an ADC in the third embodiment.
Figure 13:
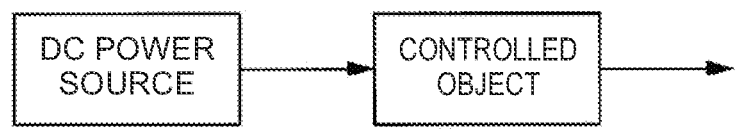
FIG. 13 is a diagram illustrating an exemplary DC power source and an exemplary controlled object.
Figure 14:
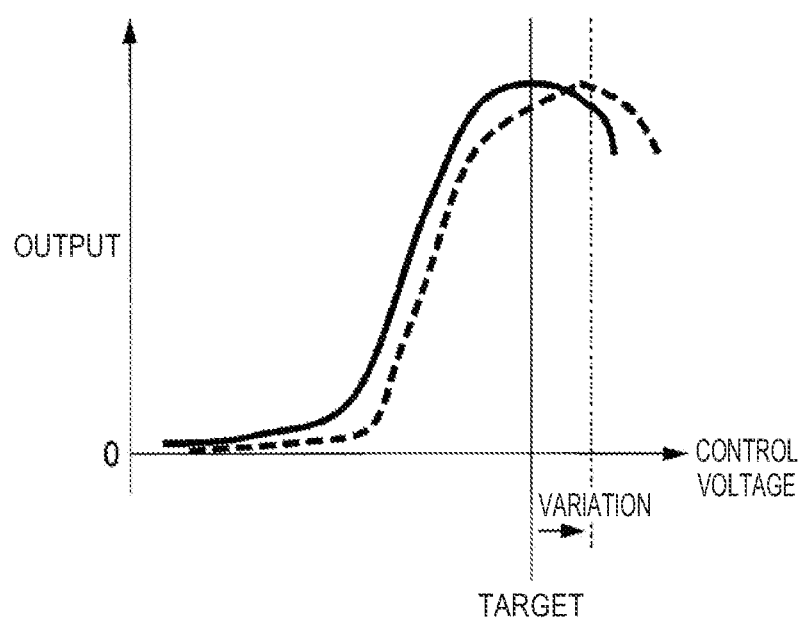
FIG. 14 is a diagram illustrating the relation between control voltage and the output from the controlled object.

FIG. 12 is a diagram illustrating an exemplary dither signal, an exemplary signal (RefPattern) indicating the pattern of the dither signal, and an exemplary output from the ADC 15. In FIG. 12, each period "Td" includes three positive-value durations and three negative-value durations. In the third embodiment, similarly to the case of "A" illustrated in FIG. 18, a dither component that changes in a pattern same as the pattern of the dither signal as the output from the dither signal generator 101c is superimposed on the output from the controlled object 12. In the case of "C" illustrated in FIG. 18, the dither component having a phase inverted with respect to the phase of the dither signal is superimposed on the output from the controlled object 12. In FIG. 12, similarly to the case of "A" illustrated in FIG. 18, the phase of the signal indicating the pattern of the dither signal and the phase of the output from the ADC 15 are substantially in phase. In the third embodiment, the value of the additional character "L" is one to eight.

The ADC 15 samples an output from the monitor unit 14c at the time interval of "Td/8". The data storage 105 stores this sampled data. When "8×p" pieces of sampled data as sampled data of the pattern of the dither signal corresponding to the "p" periods are stored in the data storage 105, the data storage 105 outputs the sampled data corresponding to the "p" periods to the waveform correction unit 106.

The data storage 105 deletes, in the data storage 105, the sampled data corresponding to the "p" periods and output to the waveform correction unit 106. The data storage 105 stores "8×p" pieces of sampled data as sampled data of the pattern of the dither signal corresponding to the next "p" periods.

Operation of sampling by the ADC 15 is synchronized with the pattern of the dither signal. The waveform correction unit 106 refers to the pattern (RefPattern) of the dither signal. Thus, the waveform correction unit 106 can identify whether each piece of sampled data "dK_1" to "dK_8" is sampled data acquired in a duration in which the dither signal has a positive value or sampled data acquired in a duration in which the dither signal has a negative value.

The waveform correction unit 106 is a digital circuit, and the signal indicating the pattern of the dither signal is a signal of array data, the number of elements of which is "8". In identification processing, the waveform correction unit 106 refers to the numerical value of the "L"-th element of the array data in the signal indicating the pattern of the dither signal. Thus, the identification processing ends instantaneously when sampled data "dK_1" to "dK_8" stored in the data storage 105 is acquired by the waveform correction unit 106. Thus, no wait time needs to be provided for each period "Td".

To further simplify the identification processing, the pattern of the dither signal may be expressed by not an integer (8-bit) variable but eight pieces of flag data. The pattern of the dither signal may be expressed by the two values of "Hi" and "Lo" instead of being expressed by a positive value and a negative value.

In the third embodiment, Expression (1) is expressed as Expression (3). In Expression (3), Σ represents a sum over "K=1" to "K=p".

$$\Sigma\{(dK\_1+dK\_3+dK\_5+dK\_6-dK\_2-dK\_4-dK\_7-dK\_8)\times W\}/(8\times p) \quad (3)$$

In the polynomial in the numerator of Expression (3), sampled data "dK_L" for which the coefficient "W" is a positive value is data acquired in a duration in which the dither signal has a positive value or is at the level of "Hi". Sampled data "dK_L" for which the coefficient "W" is a negative value is data acquired in a duration in which the dither signal has a negative value or is at the level of "Lo".

In the third embodiment, the synchronization detection device 10c executes the waveform correction processing on the output from the ADC 15 when at least one of the first condition, the second condition, and the third condition holds. However, the sign of each term in the polynomial of sampled data needs to be correlated with the sign of the pattern of the dither signal so that the polynomial of the sampled data can be compared with a threshold value such as "th1", "th2", or "th3".

The waveform correction unit 106 determines whether the first condition is satisfied based on whether varying sampled data exceeds the threshold value "th1" in a duration in which the level of the signal indicating the pattern of the dither signal is maintained at the same level.

In FIG. 12, the first condition holds when |dK_5−dK_6| is larger than the threshold value "th1" or when |dK_7−dK_8| is larger than the threshold value "th1". When the first condition is satisfied, the waveform correction unit 106 substitutes the same value into each pieces of sampled data "dK_1" to "dK_8". When the first condition is satisfied, the waveform correction unit 106 may set zero to the coefficient "W" of Expression (3) for the additional character "K". However, in a case in which the value of the additional character "L" is equal to or smaller than four, only one sampling point exists in a duration in which the level of the signal indicating the pattern of the dither signal is maintained at the same level. The one sampling point cannot be used for determination of whether the first condition is satisfied.

The waveform correction unit 106 determines whether the second condition is satisfied by using the polynomial of eight pieces of sampled data "dK_L" to which the additional character "K" is common. The waveform correction unit 106 determines the positive/negative sign of each term of the polynomial in accordance with the level of the pattern of the dither signal.

For example, when the level of the pattern of the dither signal is a high level, the waveform correction unit 106 determines that the sign of each term of the polynomial is positive. For example, when the level of the pattern of the dither signal is the high level "Hi", the waveform correction unit 106 determines that the sign of each term of the polynomial is positive.

In other words, when the level of the pattern of the dither signal is the low level "Lo", the waveform correction unit 106 determines that the sign of each term of the polynomial is negative.

In FIG. 12, when the value "|(dK_1+dK_3+dK_5+dK_6)−(dK_2+dK_4+dK_7+dK_8)|" for the additional character "K" exceeds the threshold value "th2", the waveform correction unit 106 determines that the dither component is detected. Similarly to the example illustrated in FIG. 4, the waveform correction unit 106 binarizes sampled data "dK_L" of the additional character "K" to the constant "dmax" and the constant "dmin".

The waveform correction unit 106 may determine whether the third condition is satisfied. As for intensity change of sampled data "dK_L" of the common additional character "K", the waveform correction unit 106 focuses on intensity change of the output (sampled data) from the ADC 15 before and after the level of the pattern (RefPattern) of the dither signal switches in a specific direction (for example, direction from the high level "Hi" to the low level "Lo").

In FIG. 12, for example, the level of the pattern of the dither signal switches from the high level "Hi" to the low level "Lo" through sampled data "dK_1" to "dK_2". In other words, the pattern of the dither signal has a down edge through sampled data "dK_1" to "dK_2".

Only sampled data "dK_1" is included in a duration of the high level "Hi" right before the pattern of the dither signal switches from the high level "Hi" to the low level "Lo". Only sampled data "dK_2" is included in a duration of the low level "Lo" right after the pattern of the dither signal switches from the high level "Hi" to the low level "Lo".

The waveform correction unit 106 determines whether the absolute value "|dK_1−dK_2|" of difference in the level of sampled data before and after the switching exceeds the threshold value "th3". When the absolute value "|dK_1−dK_2|" of difference in the level of sampled data exceeds the threshold value "th3", the waveform correction unit 106 records the signs of "dK_1" and "dK_2" in the memory 201.

In FIG. 12, for example, the level of the pattern of the dither signal switches from the high level "Hi" to the low level "Lo" through sampled data "dK_3" to "dK_4". The waveform correction unit 106 determines whether the absolute value "|dK_3−dK_4|" of difference in the level of sampled data exceeds the threshold value "th3". When the absolute value "|dK_3−dK_4|" of difference in the level of sampled data exceeds the threshold value "th3", the waveform correction unit 106 records the signs of "dK_3" and "dK_4" in the memory 201.

In FIG. 12, for example, the level of the pattern of the dither signal switches from the high level "Hi" to the low level "Lo" through sampled data "dK_6" to "dK_7". The waveform correction unit 106 determines whether the absolute value "|dK_6−dK_7|" of difference in the level of sampled data exceeds the threshold value "th3". When the absolute value "|dK_6−dK_7|" of difference in the level of sampled data exceeds the threshold value "th3", the waveform correction unit 106 records the signs of "dK_6" and "dK_7" in the memory 201.

Figure 18:
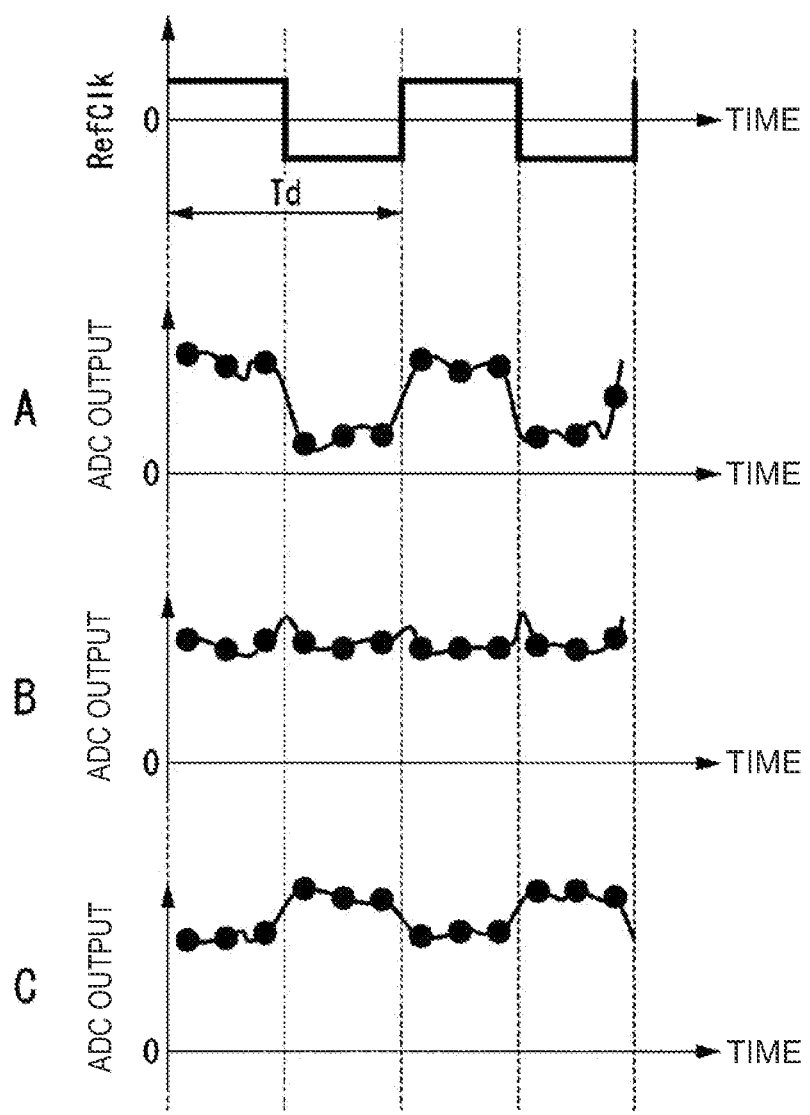
FIG. 18 is a diagram illustrating an exemplary reference clock, an exemplary output from the controlled object, and an exemplary output from the ADC.

When all signs recorded for sampled data of the common additional character "K" are positive, the waveform correction unit 106 determines that a phase same as the phase of the pattern of the dither signal is obtained (corresponding to "A" illustrated in FIG. 18).

When all signs recorded for sampled data of the common additional character "K" are negative, the waveform correction unit 106 determines that a phase opposite to the phase of the pattern of the dither signal is obtained (corresponding to "C" illustrated in FIG. 18).

When any sign among all signs recorded for sampled data of the common additional character "K" does not match the sign of the pattern of the dither signal, the third condition is satisfied, and thus the waveform correction unit 106 may discard sampled data "dK_1" to "dK_8" of the additional character "K" for which processing of determining whether the threshold value "th3" is exceeded is executed, and may update all pieces of sampled data "dK_1" to "dK_8" to the same value. The waveform correction unit 106 derives Expression (3) for sampled data of the additional character "K" by setting the value of the coefficient "W" in Expression (1) to be zero.

The waveform correction unit 106 may focus on intensity change of sampled data "dK_L" of the common additional character "K" before and after the level of the pattern of the dither signal switches from the low level "Lo" to the high level "Hi". The number of timings to be focused increases as the pattern length of the dither signal increases, and thus a limited part of the pattern length of the dither signal may be focused.

As described above, the synchronization detection device 10c of the third embodiment includes the waveform correction unit 106. The correction unit 400 of the waveform correction unit 106 corrects sampled data of a waveform (analog signal) on which a dither signal is superimposed, for each period "Td/m" of the pattern of the dither signal (reference signal) in accordance with the period "Td" of the dither signal. The waveform correction unit 106 (multiplication unit) multiplies the corrected sampled data by the weight coefficient "W" that is different for each level of the pattern of the dither signal and associated with the timing of the pattern of the dither signal. The averaging unit 402 of the waveform correction unit 106 derives, as a detection result, the average of a result of the multiplication of the corrected sampled data by the weight coefficient "W".

Accordingly, it is possible to reduce a processing time required for the accuracy of synchronization detection to be at certain accuracy or higher.

In the output from the reference signal generator (dither signal generator 101c), a pattern (specific pattern) in which high and low levels are predetermined is repeated in the "period Td/m". In the period "Td/m", the number of high levels and the number of low levels included in the specific pattern may be equal to each other.

Although each embodiment of the present invention is described above in detail with reference to the accompanying drawings, specific configurations are not limited to the present embodiment but include designs and the like without departing from the scope of the present invention.

INDUSTRIAL APPLICABILITY

The present invention is applicable to a synchronization detection device configured to detect, separately from noise, a signal provided with dithering.

REFERENCE SIGNS LIST 1a, 1b, 1c feedback system
10a, 10b, 10c synchronization detection device
11 DAC
12 controlled object
13 tap
14, 14a, 14b, 14c monitor unit
15 ADC
100 calculation unit
101a, 101b, 101c dither signal generator
102 addition unit
103 multiplier
104 synchronization detection unit
105 data storage
106 waveform correction unit
107 multiplier
108 multiplier
109 clock oscillator
200 processor
201 memory
202 storage device
300 feedback system
400 correction unit
401 multiplication unit
402 averaging unit

The invention claimed is:

1. A synchronization detection device comprising:
a processor; and
a storage medium having computer program instructions stored thereon, when executed by the processor, being configured to:
correct sampled data of a waveform on which a dither signal is superimposed, for each period of a reference signal in accordance with a period of the dither signal;
multiply the corrected sampled data by a weight coefficient that is different for each level of the reference signal and associated with a timing of the reference signal; and
derive, as a detection result, an average of a result of the multiplication of the corrected sampled data by the weight coefficient.

2. The synchronization detection device according to claim 1, wherein when intensity change uncorrelated with intensity change of the reference signal is detected in the sampled data, the computer program instructions further configured to reduce the intensity change of the sampled data.

3. The synchronization detection device according to claim 1, wherein when intensity change having correlation at a certain value or larger or inverse correlation with the reference signal is detected in the waveform, the computer program instructions further configured to enhance a frequency component of the dither signal superimposed on the waveform.

4. The synchronization detection device according to claim 1, wherein when intensity change inconsistent with a sign pattern of the reference signal is detected in the waveform, the computer program instructions further configured to reduce the intensity change.

5. A non-transitory computer-readable medium including computer-executable instructions that, upon execution of the instructions by a processor of a computer, cause the computer to function as the synchronization detection device according to claim 1.

6. A synchronization detection method executed by a synchronization detection device, the synchronization detection method comprising:
a correction step of correcting sampled data of a waveform on which a dither signal is superimposed, for each period of a reference signal in accordance with a period of the dither signal;
a multiplication step of multiplying the corrected sampled data by a weight coefficient that is different for each level of the reference signal and associated with a timing of the reference signal; and
an averaging step of deriving, as a detection result, an average of a result of the multiplication of the corrected sampled data by the weight coefficient.

7. The synchronization detection method according to claim 6, further comprises reducing the intensity change of the sampled data when intensity change uncorrelated with intensity change of the reference signal is detected in the sampled data.

8. The synchronization detection method according to claim 6, further comprises enhancing a frequency component of the dither signal superimposed on the waveform when intensity change having correlation at a certain value or larger or inverse correlation with the reference signal is detected in the waveform.

9. The synchronization detection method according to claim 6, further comprises reducing the intensity change when intensity change inconsistent with a sign pattern of the reference signal is detected in the waveform.

* * * * *